(12) United States Patent
Tachibana et al.

(10) Patent No.: US 7,339,114 B2
(45) Date of Patent: Mar. 4, 2008

(54) CABLE, CABLE CONNECTION METHOD AND CABLE WELDER

(75) Inventors: Yuko Tachibana, Chiba (JP); Kazuya Akashi, Chiba (JP); Shigeru Ashida, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 10/510,031

(22) PCT Filed: Apr. 2, 2003

(86) PCT No.: PCT/JP03/04232

§ 371 (c)(1),
(2), (4) Date: Dec. 9, 2004

(87) PCT Pub. No.: WO03/085787

PCT Pub. Date: Oct. 16, 2003

(65) Prior Publication Data

US 2005/0087359 A1    Apr. 28, 2005

(30) Foreign Application Priority Data

Apr. 4, 2002 (JP) ............................. 2002-102769
Jun. 17, 2002 (JP) ............................. 2002-176210

(51) Int. Cl.
*H01R 4/00* (2006.01)
(52) U.S. Cl. .................... 174/84 R; 174/84 C
(58) Field of Classification Search ............. 174/74 R, 174/77 R, 84 R, 88 R; 439/492, 494
See application file for complete search history.

(56) References Cited

U.S. PATENT DOCUMENTS

| | | | | |
|---|---|---|---|---|
| 5,246,384 A | * | 9/1993 | Sato ........................... 439/585 |
| 5,250,127 A | * | 10/1993 | Hara ........................... 156/52 |
| 5,660,742 A | * | 8/1997 | Warner et al. ........... 219/85.16 |
| 5,724,730 A | * | 3/1998 | Tanaka ........................ 29/868 |
| 5,780,774 A | * | 7/1998 | Ichikawa et al. ......... 174/88 R |
| 5,808,260 A | * | 9/1998 | Asakura et al. .......... 219/56.22 |
| 6,204,467 B1 | * | 3/2001 | Greenholtz et al. ...... 219/86.25 |
| 6,376,773 B1 | * | 4/2002 | Maegawa ................. 174/88 R |
| 6,444,910 B1 | * | 9/2002 | Goto ........................ 174/70 B |
| 6,858,804 B2 | * | 2/2005 | Murakami et al. ........ 174/84 R |
| 2003/0064625 A1 | * | 4/2003 | Ozai ........................... 439/579 |

FOREIGN PATENT DOCUMENTS

| | | |
|---|---|---|
| JP | 60-50079 | 11/1985 |
| JP | 02-132783 | 5/1990 |
| JP | 3-501185 A | 3/1991 |
| JP | 07-153519 | 6/1995 |

(Continued)

*Primary Examiner*—William H. Mayo, III
(74) *Attorney, Agent, or Firm*—Sughrue Mion, PLLC

(57) ABSTRACT

A connection method for connecting an end of a signal wire (53) of a cable (51) to the connecting face of a contact (59) of a connector (52). The lengthwise direction of the connecting face of the contact (59) and the lengthwise direction of the signal wire (53) are mutually matched in connection. The end of the signal wire (53) is pressured against the connecting part by a pair of electrodes (69A, 69B) disposed in mutual separation in the lengthwise direction of the signal wire (53), and an electric current is passed between the pair of electrodes (69A, 69B). Thereby, the end of the cable (51) and the connecting part are mutually welded.

8 Claims, 16 Drawing Sheets

FOREIGN PATENT DOCUMENTS

| | | |
|---|---|---|
| JP | 09-161936 | 6/1997 |
| JP | 10-080777 | 3/1998 |
| JP | 11-354215 | 12/1999 |
| JP | 2000-068007 | 3/2000 |
| JP | 2003-109708 | 4/2003 |

\* cited by examiner

CABLE, CABLE CONNECTION METHOD AND CABLE WELDER

TECHNICAL FIELD

The present invention relates to a cable and a cable connection method and cable welding device therefor, and more specifically to the welding of a conductor of a cable to the connecting face of a contact of a connector or substrate.

BACKGROUND ART

In conventional technology, connectors having a configuration in which the conductor (conducting wire) of a cable (electric wire) is soldered to the contact (a pad) of a connector are well-known, for example Japanese Unexamined Patent Application Publication No. 2000-68007.

A problem affecting the above described conventional connector is that as the conductor of the cable is soldered to the contact of the connector, rapid changes in the structure and the material substance occur in the boundary of the solder and the conductor and the boundary of the solder and contact, leading to substantial attenuation when the conventional connector (cable) is used for transmission of a high frequency signal.

In order to solve the abovementioned problems, it is an object of the present invention to provide a cable and a cable connection method and cable welding device therefor wherein the occurrence of the above described problem of signal attenuation is reduced when a high frequency signal is transmitted.

DISCLOSURE OF THE INVENTION

A cable connection method according to a first aspect of the present invention is a method for connecting an end of a conductor of a cable to the connecting face of a contact of a connector or substrate such that the lengthwise direction of the connecting face and the lengthwise direction of the conductor are mutually matched in the connection, wherein the end of the conductor is pressured against the connecting face by a pair of electrodes mutually separated in the lengthwise direction of the conductor and an electric current is passed between the pair of electrodes, welding the end of the cable and the connecting face together.

According to the above described aspect, as the conductor of the cable and the contact are mutually welded together while pressured by electrodes, an alloy layer by the welding can be definitively formed along the connecting face in the contact. Moreover, rapid changes affecting the structure and composition between the conductor and the contact do not occur due to the existence of the alloy layer, but as these changes occur gradually and successively, when a high frequency signal is transmitted between the conductor and the contact reflection of the transmitted signal does not occur easily, leading to decreased attenuation of the signal.

A cable connection method according to a second aspect of the present invention is a cable connection method according to the first aspect in which the state of the welding is within the scope from the condition in which the depth at the top of a color changed part forming an arc on the contact is above 0.1 mm to the condition immediately prior to the condition of blasting of the contact.

According to the above described aspect, the extent of the welding between the conductor of the cable and the contact can easily be objectively recognized by the size of the color changed part arising in the contact due to the welding and the existence or otherwise of blast in the contact due to the welding, enabling conditions that facilitate stable processing to be ascertained simply, such that the quality of the welded part when the conductor of the cable and the contact are mutually welded together can easily be maintained in a desirable condition.

A cable connection method according to a third aspect of the present invention is a cable connection method according to the first aspect in which the state of the welding is within the scope from the condition in which the dispersion of a layer of precious metal thinly covering the surface of the conductor of the cable, forms an alloy layer of that precious metal in the contact that is of a depth of 5 μm to the condition in which that alloy layer is half the thickness of the contact.

According to the above described aspect, the extent of the welding between the conductor of the cable and the contact can easily be objectively recognized by the condition of the dispersion of the alloy layer arising in the contact due to the welding, enabling conditions that facilitate stable processing to be ascertained simply, such that the quality of the welded part when the conductor of the cable and the contact are mutually welded together can easily be maintained in a desirable condition.

A cable connection method according to a fourth aspect of the present invention is a cable connection method according to any one of the first to third aspects in which the part of the conductor that comes into contact with the connecting face of the contact is formed as a flat surface and the part of the conductor that comes into contact with the electrodes is formed as a flat surface.

According to the above described aspect, a large area of contact is realized between the contact and the conductor as the part of the conductor in contact with the connecting face of the contact is formed as a flat surface, thus the strength of the weld between the contact and the conductor is increased. Further, the conductor can be placed in a stable condition when placed on the contact in order to weld the conductor and the contact together.

Moreover, as the part of the conductor that comes into contact with the electrodes is formed as a flat surface, when the conductor is pressed by the electrodes, electrical resistance between the conductor and the electrodes is small, further the pressure affecting each unit of area that arises between the conductor and the electrodes is reduced such that welding between the conductor and the electrodes is easily prevented.

A cable according to a fifth aspect of the present invention is a cable having a configuration in which an end of a conductor of the cable is connected to the connecting face of a contact of a connector or substrate such that the lengthwise direction of the connecting face and the lengthwise direction of the conductor are mutually matched in the connection, wherein a long elongated welded part is formed in the lengthwise direction of the conductor in the connecting part between the conductor and the contact, and the state of the welding in the welded part is within the scope from the condition in which the depth at the top of a color changed part forming an arc on the contact is above 0.1 mm to the condition immediately prior to the condition of blasting of the contact.

According to the above described aspect, an alloy layer is formed in the contact along the connecting face of the contact by the welding, and due to the existence of this alloy layer the structure and composition between the conductor and the contact changes gradually and successively, such that when a high frequency signal is transmitted between the conductor and the contact reflection of the transmitted signal does not occur easily, leading to decreased attenuation of the signal.

Moreover, as the conductor of the cable and the contact are welded together, in the same manner, when a high frequency signal is transmitted between the conductor and the contact reflection of the transmitted signal does not occur easily, leading to a reduction in the number of errors occurring when the signal is transmitted.

Further, the extent of the welding between the conductor of the cable and the contact can easily be objectively recognized by the size of the color changed part arising in the contact due to the welding and the existence or otherwise of blast in the contact due to the welding, enabling conditions that facilitate stable processing to be ascertained simply, such that the quality of the welded part when the conductor of the cable and the contact are mutually welded together can easily be maintained in a desirable condition.

The invention according to a sixth aspect of the present invention is a cable having a configuration in which an end of a conductor of the cable is connected to the connecting face of a contact of a connector or substrate such that the lengthwise direction of the connecting face and the lengthwise direction of the conductor are mutually matched in the connection, wherein a long elongated welded part is formed in the lengthwise direction of the conductor in the connecting part between the conductor and the contact, and the state of the welding in the welded part is within the scope from the condition in which the dispersion of a layer of precious metal thinly covering the surface of the conductor of the cable forms an alloy layer of that precious metal in the contact that is of a depth of 5 µm to the condition in which the alloy layer is half the thickness of the contact.

According to the above described aspect, the state of the welding between the conductor of the cable and the contact can easily be objectively recognized by the condition of the dispersion of the alloy layer arising in the contact due to the welding, enabling conditions that facilitate stable processing to be ascertained simply, such that the quality of the welded part when the conductor of the cable and the contact are mutually welded together can easily be maintained in a desirable condition.

The invention according to a seventh aspect of the present invention is a cable according to either the fifth or sixth aspects in which the part of the conductor that is welded to the connecting face of the contact is formed as a flat surface and the part of the conductor connected to the electrodes is formed as a flat surface.

According to the above described aspect, a large area of contact is realized between the contact and the conductor as the part of the conductor in contact with the connecting face of the contact is formed as a flat surface, thus the strength of the weld between the contact and the conductor is increased.

A cable welding device according to an eighth aspect of the present invention is for connecting an end of a conductor of a cable to the connecting face of a contact of a connector or substrate such that the lengthwise direction of the connecting face and the lengthwise direction of the conductor are mutually matched in the connection, this cable welding device comprising a base on which the connector or substrate having the contact can be disposed, a pair of electrodes mutually separated in the lengthwise direction of the conductor, pressure means capable of pressing, via the pair of electrodes, the end of the conductor in contact with the contact, thereby pressuring the end of the conductor against the connecting face and voltage applying means capable of applying voltage between the electrodes.

According to the above described aspect, the connector or substrate having the contact and the end of the conductor of the cable are desposed on a base, and the end of the conductor is pressed by the pair of electrodes mutually separated in the lengthwise direction of the conductor such that the end of the conductor is pressured against the connecting face and voltage is applied between the electrodes enabling the conductor of the cable to be welded to the contact, thus usage of this welding device enables such welding of the cable to be easily performed at any time under determined and stable conditions, and enables the cable to be produced at any time under determined and stable conditions.

A cable welding device according to a ninth aspect of the present invention is the cable welding device according to the eighth aspect, having a configuration such that when a plurality of groupings of a contact and the end of a conductor exist, the pair of electrodes moves to positions enabling each of the groupings to be welded and applies pressure to each of those groupings.

According to the above described aspect, when a plurality of groupings of contacts and the ends of conductors exist, the pair of electrodes can move to a position in which each of those groupings can be welded, and pressure can be applied to each of those groupings, therefore even when there are a plurality of such welded parts of the conductor of a cable and a contact disposed in the connector, in other words, there are a plurality of cables protruding from the connector, a conductor of each of the cables can easily be welded to each of the contacts of the connector, further even where a plurality of pairs of electrodes are not provided, in other words, simply by providing a single pair of electrodes and the power supply for the electrodes, welding of the plurality of welded parts can easily be performed in succession, and a simple configuration of welding device is realized.

Further, as the pair of electrodes can be moved to perform the welding, even if there is a minute difference in the height of the conductors of each of the cables the pressuring applied can easily be maintained at the appropriate level.

A cable according to a tenth aspect of the present invention is a cable comprising a connector including a base having a plurality of conductive contacts and a cable main body including a plurality of wire connectors that connect respectively to the plurality of contacts, wherein each of the wire connectors and each of the contacts are mutually and electrically connected by welding.

According to the above described aspect, as each wire conductor of the cable main body is welded to each connector and each connector and each wire conductor are mutually connected, the conditions can be found for definitive formation of an alloy layer by welding between the wire conductor of the cable main body and the contact of the connector. Moreover, rapid changes affecting the structure and composition between the wire conductor and the contact do not occur due to the existence of the alloy layer, but as these changes occur gradually and successively, when a high frequency signal is transmitted between the wire conductor and the contact reflection of the transmitted signal does not occur easily, leading to decreased attenuation of the signal.

A cable according to an eleventh aspect of the present invention is a cable according to the tenth aspect wherein the base includes a flat plate having a front face and a rear face, a plurality of strip shaped first signal contacts positioned at determined intervals along the y axial direction that is one direction parallel to the front face and disposed extending in the x axial direction that is the other direction parallel to the front face, a plurality of strip shaped second signal contacts disposed on the rear face and opposing the first signal contacts such that the flat plate is interposed therebetween, and a plurality of ground contacts disposed on the front face or the rear face, extending in the x axial direction and between each of the signal contacts, and wherein the wire conductor includes a first signal wire, a second signal wire and a drain wire, the first signal wire connecting to the first signal contact, the second signal wire connecting to the second signal contact and the drain wire connecting to the ground contact.

According to the above described aspect, as each signal contact and each ground contact are arranged systematically, a compact connector is easily achieved when each of the signal wires of the cable are welded to the respective contacts in a systematic arrangement.

A cable according to a twelfth aspect of the present invention is a cable according to the eleventh aspect, having a configuration wherein at the front face and the rear face each of the ground contacts are raised in the z axial direction that is a direction orthogonal to the front face and the rear face, moreover each raised part has a conductor disposed extending in the x axial direction.

According to the above described aspect, as the ground contacts are disposed so as to rise in the z axial direction and the x axial direction, intercepting between each of the signal contacts, in other words, as one signal contact existing beside other signal contact is not visible to the other signal contact, crosstalk is easily prevented from occurring between the one signal contact and the signal wire welded to the one signal contact and the other signal contact and the signal wire welded to the other signal contact.

A cable according to a thirteenth aspect of the present invention is a cable according to either the eleventh or the twelfth aspects, wherein each first signal wire, each second signal wire and each drain wire of a plurality of cables is connected to the respective first signal contact, second signal contact and ground contact of the connector.

According to the above described aspect, as each signal wire and each drain wire of a plurality of cable main bodies are welded in a systematic arrangement to the connector, a compact connector is easily achieved even where a plurality of cable main bodies are connected to the connector.

BEST MODE FOR CARRYING OUT THE INVENTION

First Embodiment

The first embodiment of the present invention will now be described with reference to the drawings.

A transmission cable (electric wire) according to the first embodiment of the present invention is a cable used as a communications transmission cable between computers such as servers. This cable is used for example when high volumes of transmission signals or the like are sent instantaneously and the reception and transmission must be performed smoothly instantaneously or simultaneously.

Figure 1:
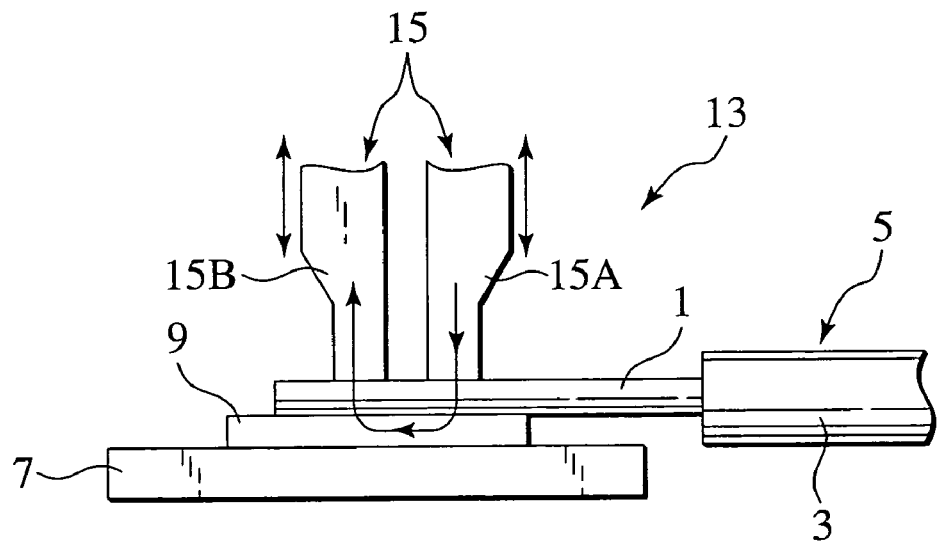
FIG. 1 is a schematic illustration showing the condition of connection of a conductor according to an embodiment of the present invention.
Figure 2:
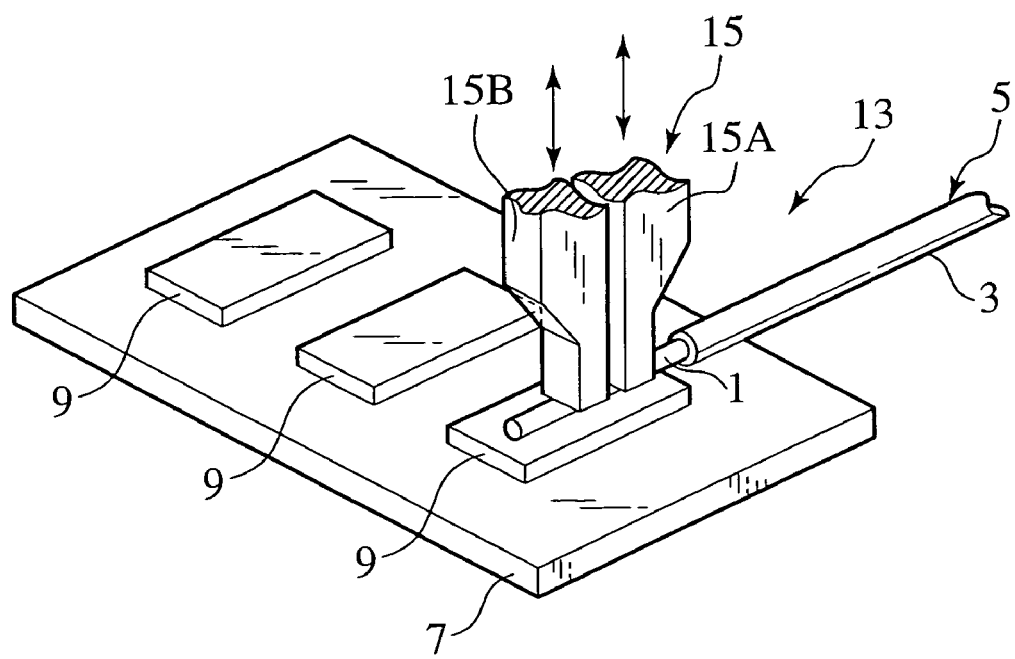
FIG. 2 is a perspective view showing the condition of connection of a conductor according to an embodiment of the present invention.

Referring to FIG. 1 and FIG. 2, an insulated wire 5 comprising a round conductor 1 for the conductor that is covered around the outside with a foamed resin insulating body 3 provides the transmission cable. This transmission cable is not shown in the entirety thereof in the drawings, however two pairs of pair wires of this insulated wire 5 are arranged parallelly wrapped in tape, this plurality of pair wires are stranded and aggregated, and after a shield is applied to the plurality of pair wires a sheath is applied around the outside thereof.

The pair wires of an insulated wire 5 of the transmission cable are then exposed at the part that connects to a terminal, and the round conductor 1 of each of the insulated wires 5 are connected to the respective connecting parts 9 of for example a connector 7 (or a substrate). A copper sheet applied to the upper surface of the connector 7 for example can be used as this connecting part 9. For this embodiment, the round conductor 1 is copper wire of 0.4 mm φ having silver plating of a thickness of 2 μm applied on the upper surface thereof.

Figure 3:
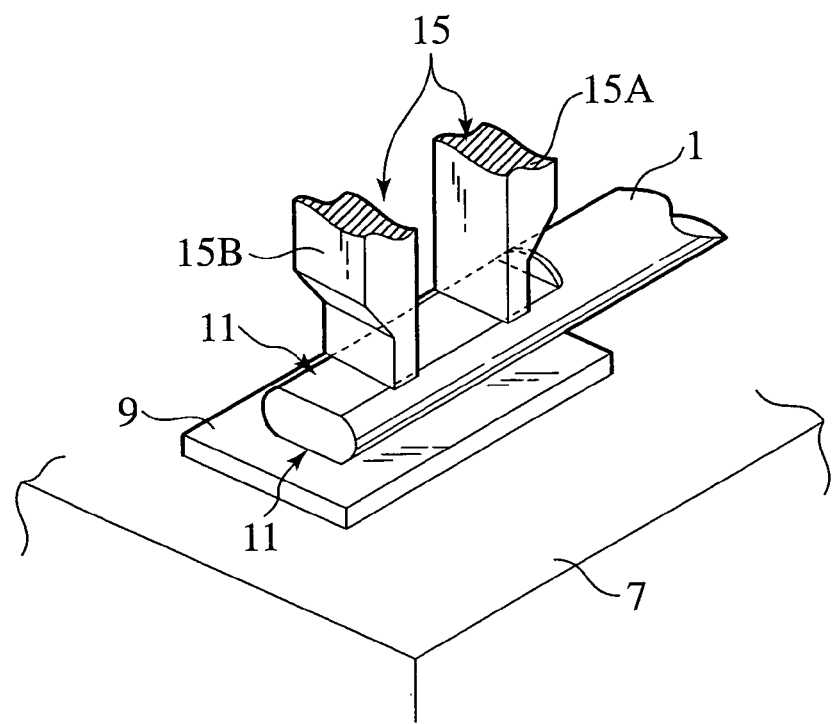
FIG. 3 is an enlarged perspective view of the connected parts shown in FIG. 1.

As shown in FIG. 3, the method of connecting the transmission cable involves having a flat part 11 that is a flat shape pressed in advance into both the top and the bottom of the round conductor 1 at the end of the insulated wire 5, disposed such that a face thereof is in contact with a connecting part 9 of the connector 7. This flat part 11 is formed only at one side of the round conductor 1 and may be disposed such that a surface thereof is in contact with the connecting part 9 of the connector 7.

As shown in FIG. 1 and FIG. 2, a pair of electrodes 15 comprised of a positive electrode 15A and a negative electrode 15B mutually separated in the lengthwise direction of the insulated wire 5 provides the connecting device 13 of the transmission cable. The round conductor 1 is pressured in the position corresponding to the flat part 11 by the positive electrode 15A and the negative electrode 15B and electric current is passed between those two electrodes. The positive electrode 15A and the negative electrode 15B are disposed so as to be able to move freely in a vertical motion simultaneously or independently.

Figure 5:
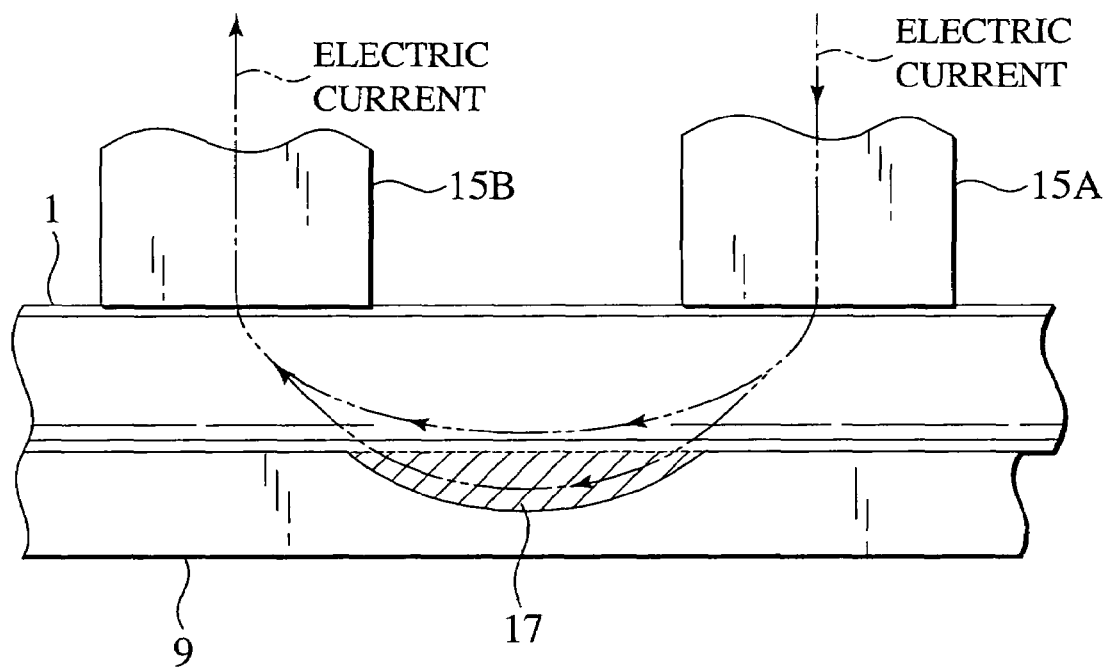
FIG. 5 is an enlarged cross-sectional view showing the condition of the nugget in the connected parts shown in FIG. 1.

As shown in FIG. 1 and FIG. 5, electric current from the positive electrode 15A passes from the round conductor 1 via the connecting part 9 of the connector 7, flowing over the comparatively short distance from the round conductor 1 to the negative electrode 15B. Naturally, there is also electric current passing inside the round conductor 1. Nonetheless, as a result of this process of directing current, heat arises from resistance at the surface of contact between the flat part 11 of the round conductor 1 and the connecting part 9 and the electric current passing this region of surface contact resistance, such that the connecting part 9 and the flat part 11 of the round conductor 1 are connected, spot welded as the vicinity of this connecting face between the flat part 11 of the round conductor 1 and the connecting part 9 is melted as shown in FIG. 5, giving rise to a so-callled nugget 17 (melted alloy layer). According to this embodiment, this nugget 17 (melted alloy layer) is an alloy layer of copper and silver.

Figure 6:
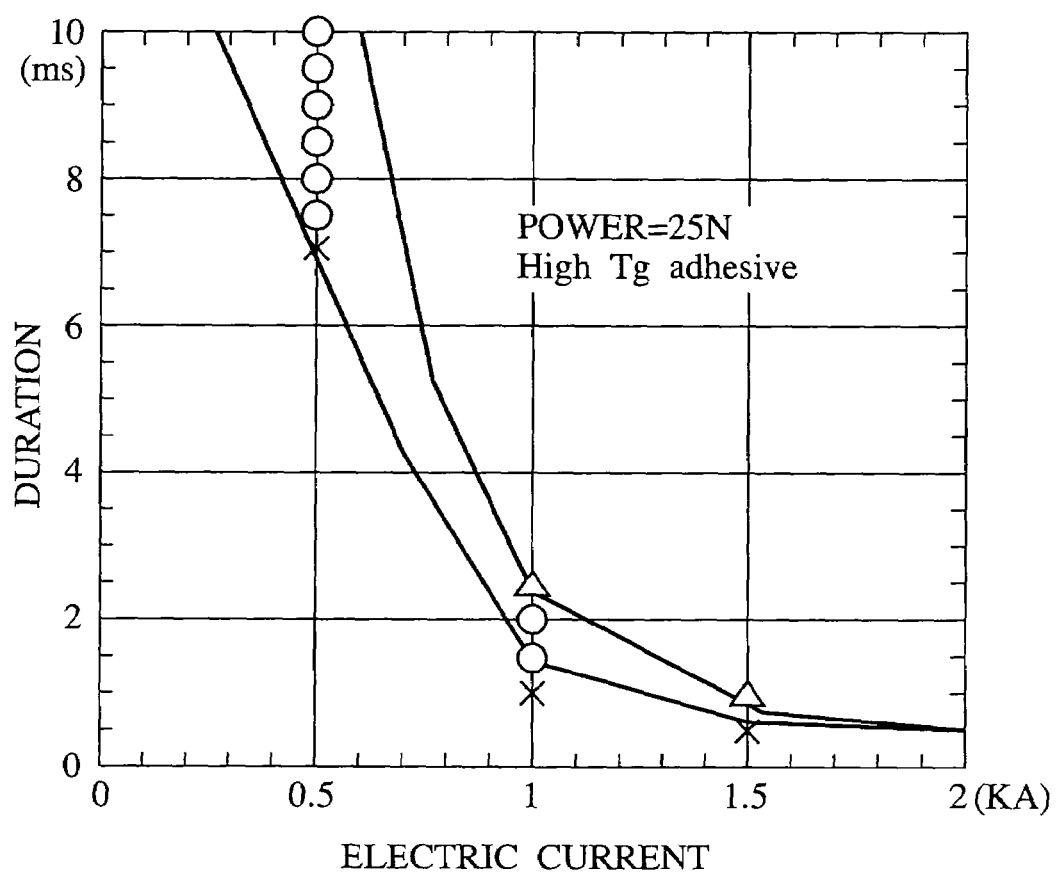
FIG. 6 is a graph showing the relationship between the duration of the electrification process and level of electric current applied to electrodes according to an embodiment of the present invention.

The relationship between the duration of the current directing process and the level of electric current required to obtain a desirable nugget 17 when the current directing process of the electrodes 15 is performed, is as shown in FIG. 6.

From the above description, it is evident that as the flat part 11 is formed in the round conductor 1 of the insulated wire 5, the round conductor 1 can be disposed in a stable condition when connected to the connecting part 9 of the connector 7, thereby providing improved workability, while as the area of the portion of contact between the flat part 11 of the round conductor 1 and the connecting part 9 of the connector 7 is substantial, the diameter of the nugget 17 (or the dimensions of the area and width of the nugget 17 in the contacting surface between the connecting part 9 and the flat part 11 of the round conductor 1) also becomes large, thereby providing increased connection strength. Further, as the connection is from the nugget 17 (melted alloy layer), there is less electrical loss than that resulting from conventional solder connections, enabling higher transmission speeds to be realized.

Figure 4:
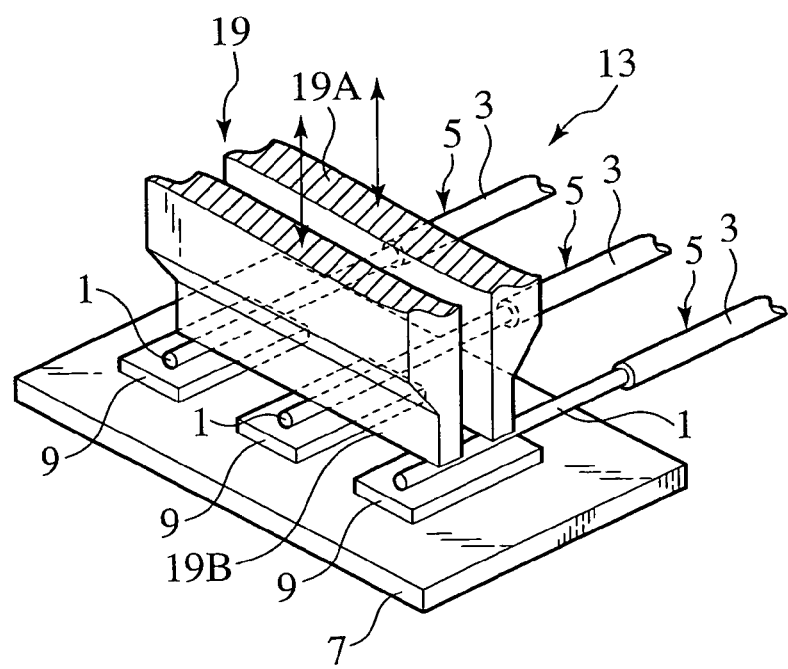
FIG. 4 is a perspective view showing the condition of connection of a plurality of conductors of a transmission cable according to an embodiment of the present invention.

Referring to FIG. 4, a plurality of connecting parts 9 are disposed on the connector 7 and the respective round conductors 1 at the end parts of the plurality of insulated wires 5 are disposed respectively corresponding to the plurality of connecting parts 9. A flat part 11 is formed in advance, pressed into each round conductor 1 of each insulated wire 5 as described above. When such a plurality of insulated wires 5 exist, these flat parts 11 can be efficiently produced by using a pressuring device such as a crimping machine or the like to apply pressure pressing the round conductors 1 of the plurality of insulated wires 5 simultaneously. Accordingly, the flat parts 11 of each of the plurality of the round conductors 1 are disposed in a stable condition such that a surface thereof is in contact with the respective corresponding connecting parts 9.

Further, to provide a connecting device 13 of the transmission cable, a pair of electrodes 19 are constructed that simultaneously pressure the plurality of round conductors 1, these electrodes comprising a bar shaped positive electrode 19A extending in a direction orthogonal to the lengthwise direction of the plurality of insulated wires 5 and a bar shaped negative electrode 19B extending substantially parallel to the positive electrode 19A, the positive electrode 19A and the negative electrode 19B being separated in the lengthwise direction of the plurality of insulated wires 5. Where the positive electrode 19A and the negative electrode 19B are of a substantial length in the elongated direction thereof having regard to the pressuring strength applied, this pair of electrodes can apply pressure simultaneously to the connecting parts 9 corresponding to each of the round conductors 1 of a large number of insulated wires 5.

The plurality of round conductors 1 are simultaneously pressured by the positive electrode 19A and the negative electrode 19B in positions mutually separated in the lengthwise direction of the insulated wires 5, and an electric current the strength of which corresponds to the number of round conductors 1 is passed between the positive electrode 19A and the negative electrode 19B.

Since the electric current from the positive electrode 19A passes each connecting part 9 from each of the plurality of round conductors 1 in the same manner as described above with respect to FIG. 1 and FIG. 2, moreover, this current flows from each round conductor 1 to the negative electrode 19B, a nugget 17 (melted alloy layer) arises between the flat part 11 of each round conductor 1 and the respective connecting parts 9 in a series welding process, such that the flat part 11 of each round conductors 1 is efficiently connected to each of the corresponding connecting parts 9.

Instead of the bar shaped electrodes shown in FIG. 4, it is possible to have a configuration in which a plurality of positive electrodes 15A and negative electrodes 15B extending vertically as shown in FIG. 2 are disposed separated in a lengthwise direction of the insulated wires 5 so as to be able to move freely in a direction orthogonal to said lengthwise direction. In this configuration, the plurality of positive electrodes 15A and negative electrodes 15B must be able to move so as to be positioned matching the position of the round conductor 1 of each of the plurality of insulated wires 5.

Experiments designed to compare the connective structure of the transmission cable according to the embodiment of this invention with a conventional solder connective structure will now be described.

Figure 7:
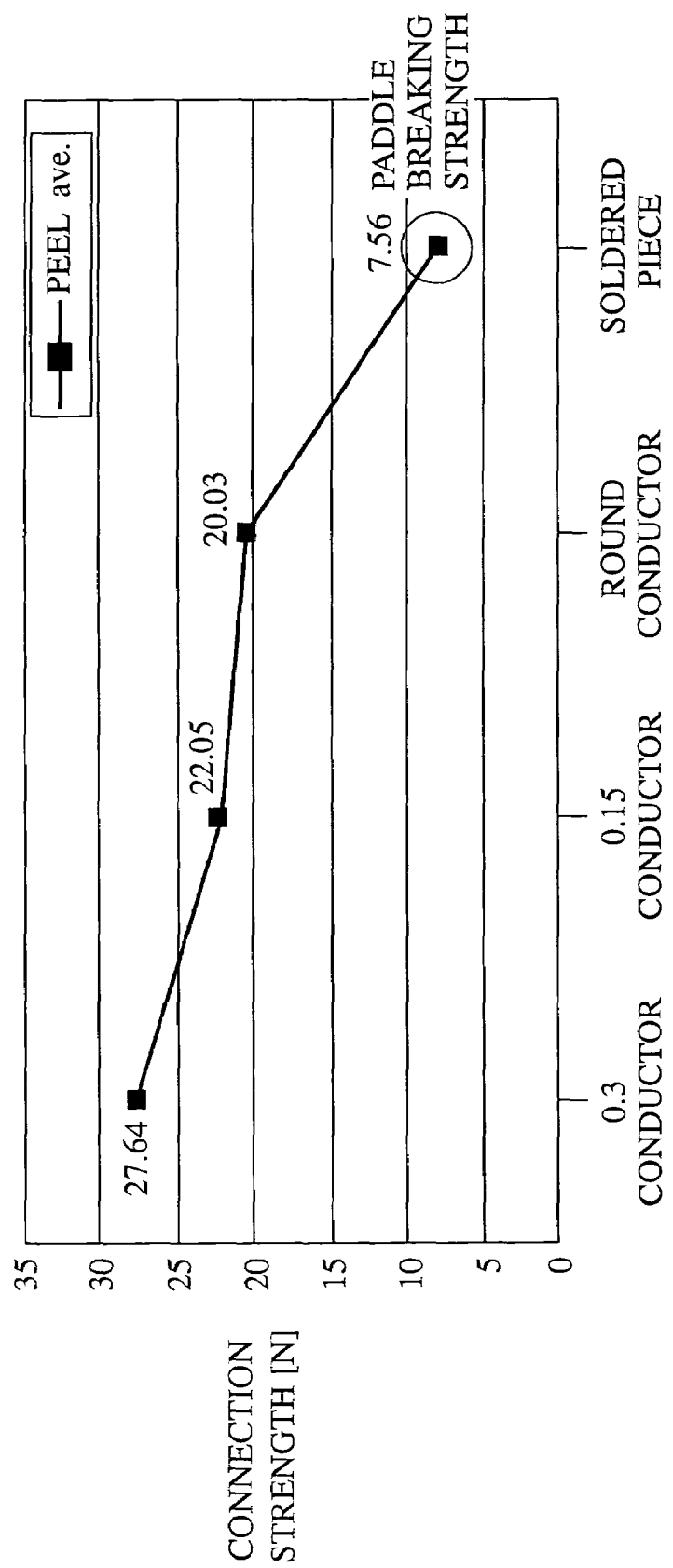
FIG. 7 is a graph showing tested peel strength of different kinds of test piece performed for the purpose of ascertaining the comparative strength of welded joints and soldered joints.
Figure 8:
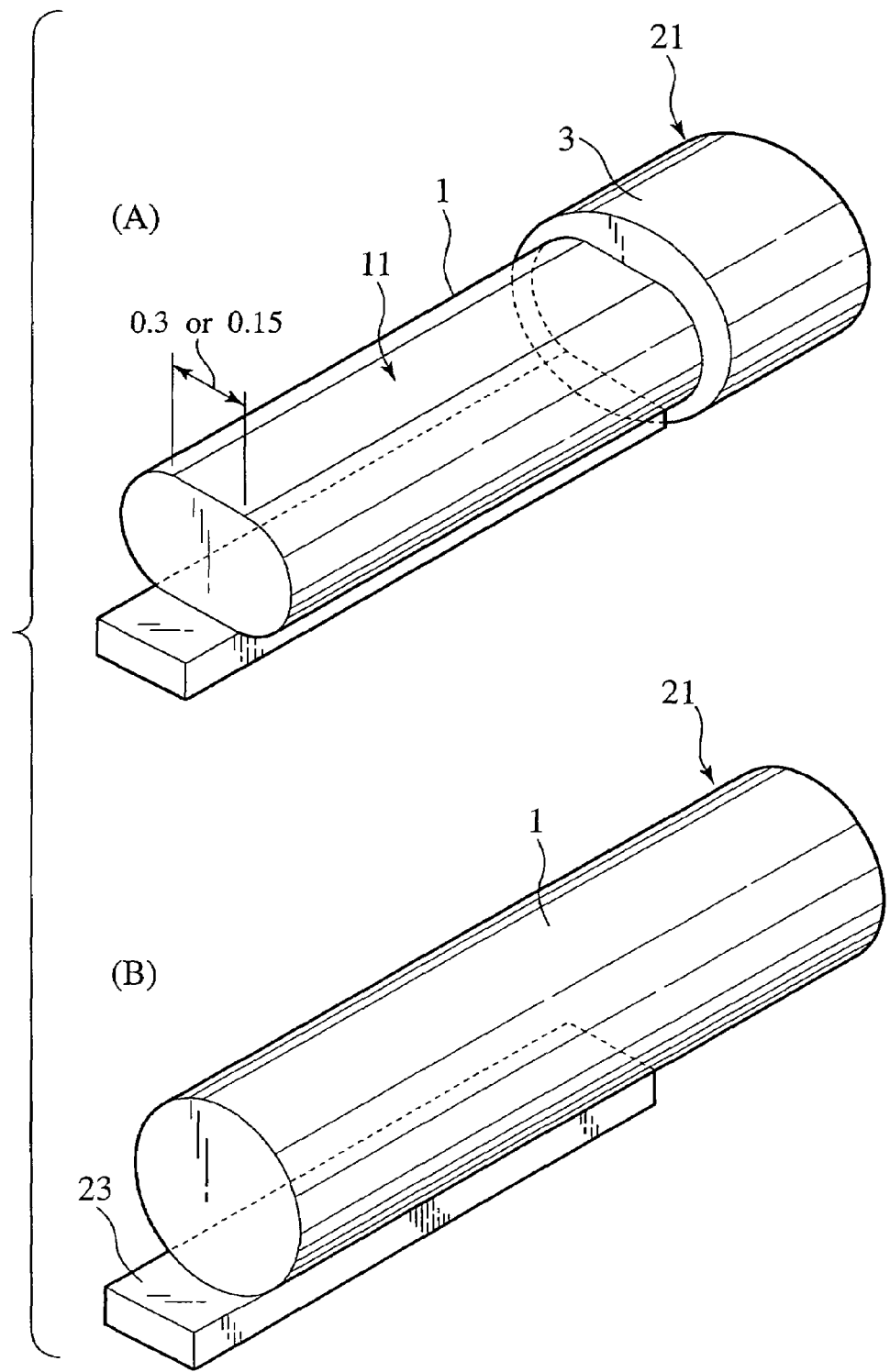
FIG. 8 is a perspective view showing part of the condition of different kinds of test pieces.
Figure 9:
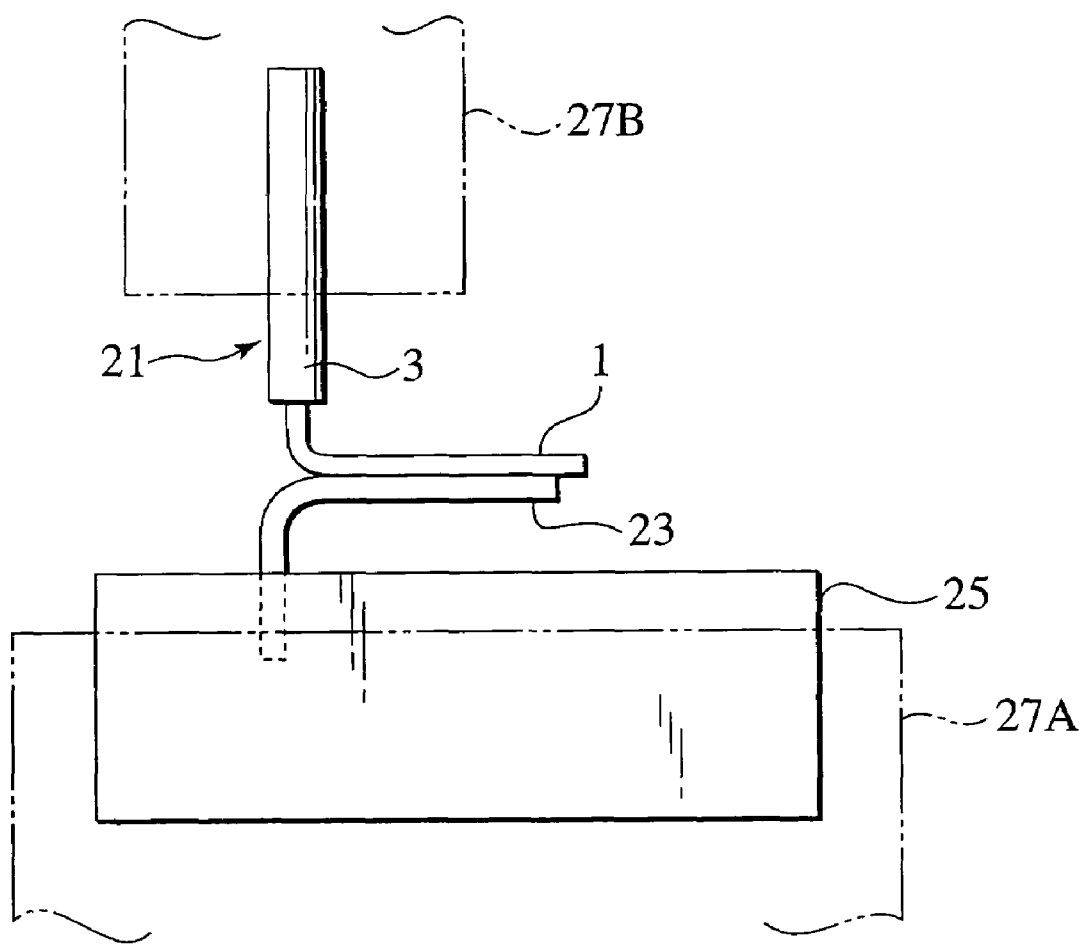
FIG. 9 is a schematic illustration showing the condition of the peel test performed for the different kinds of test pieces.

Referring to FIGS. 7 to 9, the test method was provided by a peel test performed on the connecting parts of four different types of test pieces 21. The test pieces 21 comprised firstly, two types of test piece in which a round conductor 1 exposed by peeling back from the insulating body 3 is crushed flat from the top and bottom thereof such that a flat part 11 is formed above and below as shown in FIG. 8(A), one of these pieces having a flat part 11 of a width of 0.3 mm (hereinafter "0.3 conductor") while the other test piece had a flat part 11 of a width of 0.15 mm (hereinafter "0.15 conductor").

Further, the third type of test piece 21 comprised a round conductor 1 that was simply a round form with no flat part 11 formed thereon (hereinafter "round conductor") as shown in FIG. 8(B). The fourth type of test piece 21 was soldered according to conventional technology (hereinafter "soldered piece").

A comb teeth shaped arrangement of contacts in the form of a plurality of comb arrangement teeth 23 corresponding respectively to each of the plurality of connecting parts 9 shown in FIG. 2 were utilized, and in the same manner as described with respect to the embodiment of this invention, the first three comprising three types of the test pieces 21 had a round conductors 1 welded to each of the comb arrangement teeth 23 while the fourth of the test piece 21 had a round conductor 1 soldered to each of the comb arrangement teeth 23 of the comb teeth arrangement contacts.

These four types of test piece 21 connected to the respective comb arrangement teeth 23 of the comb teeth arrangement contacts were bent at the comb arrangement teeth 23 into an "L" shape as shown in FIG. 9 and both ends of the comb arrangement teeth 23 were gripped by a securing member 25 of an experimental holding tool. After this securing member 25 was clamped by one chuck portion 27A of a tensile testing machine (not shown) and the insulating body 3 of each test piece 21 was clamped by the other chuck portion 27B of the tensile testing machine, the peel test was performed to ascertain the connection strength of each test piece by pulling each test piece by the tensile testing machine.

The peel test strengths for the four types of test piece 21 are shown in FIG. 7, revealing that the "0.3 conductor" achieved the highest value and the "0.15 conductor" recorded a higher value than the "round conductor". Accordingly, it is evident that the connection strength is higher where the area of the flat part 11 is larger. Even for the "round conductor", there is a substantially higher strength obtained than for the "soldered piece".

Figure 10:
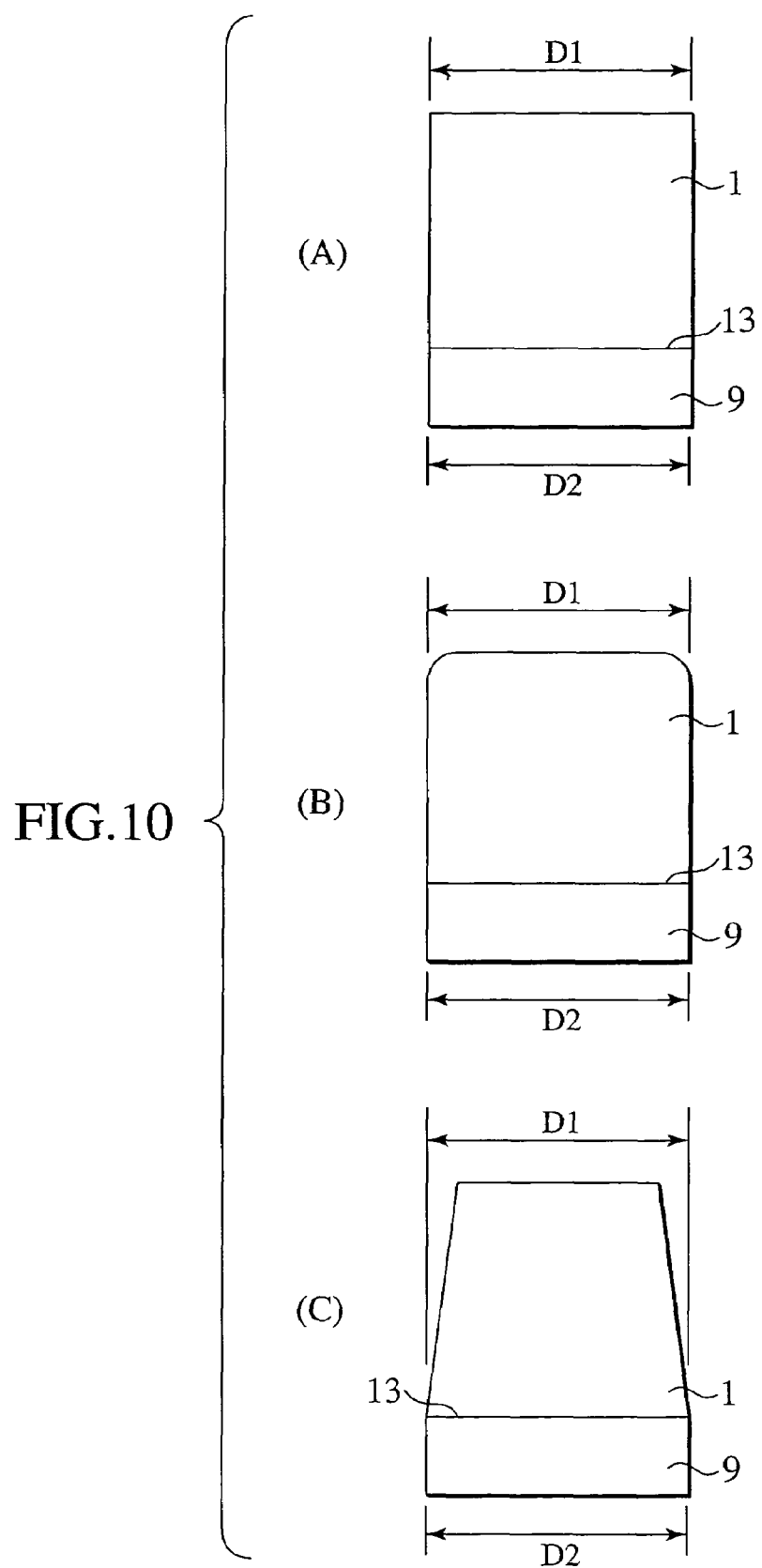
FIGS. 10(A), (B) and (C) are explanatory drawings showing three forms of conductor that are forms other than flat shaped forms.

The description with respect to the above embodiment concerned a round conductor 1 having a flat shaped form connected to the connecting part 9 of a substrate or connector 7, however, as shown in FIGS. 10(A), (B) and (C), the form of the round conductor 1 may have a rectangular shape, a somewhat transformed rectangular shape, a trapezoid form or the like, besides the flat shape.

In this case also, the surface connecting to the connecting part 9 of the connector 7 forms a flat surface 13 that is the same as the flat shaped form. In FIGS. 10(A), (B) and (C) the width D1 of the conductor 1 should be substantially the same so as not to extrude beyond width D2 of the connecting part 9 of the connector 7.

The result is, in addition to improved connection strength and workability, an improved degree of stability is achieved in the transmission characteristics provided, i.e. impedance and crosstalk.

It is to be understood that the present invention is not limited to the embodiment described above but may be practiced otherwise than as described by modifying appropriately.

The connection method for the transmission cable illustrated with respect to the first embodiment as described above is an exemplary method involving connection of the conductor of the insulated wire to the connecting part of a connector or substrate, in which a flat surface is formed at the end of the conductor and this flat surface provides an area of contact with the connecting part, while additionally pressure is applied from a pair of electrodes positioned separately with respect to each other in the lengthwise direction of the conductor and an electric current is passed between these electrodes, thereby welding together the conductor and the connecting part.

Further, as a flat surface part is formed at the end of the conductor in accordance with the above-described cable connection method, an improved degree of workability is achieved as the conductor can be disposed in a stable condition with respect to the connecting part of the connector or substrate. Moreover, for the same reason, as the flat surface part of the conductor and the connecting part of the connector have an area of face to face contact, there is a substantial area of contact achieved thereby creating a substantial area of the melted alloy layer, providing an increased degree of connection strength.

Again, the connection method for the transmission cable illustrated with respect to the first embodiment as described above is an exemplary method involving connection of the conductor of an insulated wire to the connecting part of a connector or substrate, in which flat surfaces are formed at the ends of a plurality of conductors and the respective flat surfaces of the conductors are then positioned to provide area of contact with the respective corresponding surfaces of the plurality of connecting parts, while additionally pressure is applied simultaneously to the plurality of conductors from a pair of electrodes positioned separately with respect to each other in the lengthwise direction of each of the plurality of conductors so as to be in contact simultaneously with each of the plurality of conductors, and an electric current is passed between these electrodes, thereby welding together each of the connecting parts and the conductors corresponding thereto.

Moreover, the conductors of the plurality of insulated wires can simultaneously be efficiently connected in the positions corresponding to the plurality of connecting parts of a connector or substrate.

Again, the connection structure for the transmission cable illustrated with respect to the first embodiment as described above is a connection structure connecting the end of the conductor of an insulated wire and the connecting part of a connector or substrate, in which a melted alloy layer is formed of the metal of the conductor and the metal of the connecting part in the part of contact or connecting part between the conductor and the connecting part of the connector or substrate, moreover the end of the conductor connected to the connecting part of the connector or the substrate is formed as a flat surface.

Moreover, as the end part of the conductor connected to the connecting part is formed as a flat surface, an improved degree of workability is achieved as the conductor can be disposed in a stable condition with respect to the connecting part of the connector or substrate. Moreover, for the same reason, as the flat surface of the conductor and the connecting part of the connector have an area of face to face contact there is a substantial area of contact achieved, thereby creating a substantial area of the welded alloy layer, providing an increased degree of connection strength. Again, as electrical loss in the connection of the welded alloy layer is small, no problems arise during transmission at high speeds when used in the high frequency region.

Further, in the connection structure of the above transmission cable, the width of the flat part is structured so as to be substantially the same as the width of the connecting part, therefore the connection therebetween is achieved without the flat part of the conductor protruding beyond the width of that connecting part. As a result, an improved degree of connection strength and workability is achieved, and stable transmission characteristics, in terms of impedance and crosstalk and the like, are realized.

Moreover, the connector illustrated with respect to the first embodiment as described above provides an example of a connector that comprises a connecting part that connects to the end of the conductor of the insulated wire, and a melted alloy layer formed of the metal of the connecting part and the metal of the conductor in the part of contact or connection between the connecting part and the conductor.

Further, an improved degree of workability is achieved as the conductor can be disposed in a stable condition with respect to the connecting part of the connector or substrate. Again, for the same reason, as the flat surface part of the conductor and the connecting part of the connector have an area of face to face contact, a substantial area of contact is achieved thereby, creating a substantial area of the welded alloy layer, providing an increased degree of connection strength. Moreover, as electrical loss in the connection of the welded alloy layer is small, no problems arise during transmission at high speeds when used in the high frequency region.

Moreover, the connector illustrated with respect to the first embodiment as described above provides an example of a connector that provides a plurality of connecting parts that connect to the respective corresponding ends of the conductors of a plurality of insulated wires, and a melted alloy layer simultaneously formed of the metal of the connecting parts and the metal of the conductors in the respective parts of contact or connection between the connecting parts and the respective corresponding conductors.

Again, the plurality of conductors can simultaneously be efficiently connected in the positions corresponding to the respective connecting parts of a connector or substrate.

Further, the connecting device for the transmission cable illustrated with respect to the first embodiment as described above is an exemplary connecting device of a transmission cable connecting the conductor of an insulated wire to the connecting part of a connector or substrate, comprising a pair of electrodes that are able to apply pressure to and draw away from a conductor in positions separately with respect to each other in the lengthwise direction of the conductor, the conductor having a flat part that achieves an area of contact with the connecting part of a connector or substrate, and the pair of electrodes being constructed such that an electric current is able to be passed between these electrodes when pressuring the conductor.

Moreover, as the conductor is pressured against the connecting part of the connector or substrate by the pair of electrodes positioned in mutual separation in the lengthwise direction of the conductor and an electric current is passed through them, the conductor and the connecting part of the connector or substrate are welded together by a melted alloy layer achieving a connective condition in which electric loss is minimal.

Again, the connecting device for the transmission cable illustrated with respect to the first embodiment as described above is an exemplary connecting device of a transmission cable connecting the conductor of an insulated wire to the connecting part of a connector or substrate, comprising a pair of electrodes that are able to apply pressure to and draw away from a plurality of conductors in positions separately with respect to each other in the lengthwise direction of the conductors, the conductors each having a flat part that achieves an area of contact with each of the plurality of the connecting parts of a connector or substrate, and the pair of electrodes being constructed such that an electric current is able to be passed between these electrodes when simultaneously pressuring the plurality of conductors.

Further, as the plurality of conductors are simultaneously pressured against the plurality of connecting parts of the connector or substrate by the pair of electrodes positioned in mutual separation in the lengthwise direction of the plurality of conductors and an electric current is passed through them, the plurality of conductors are simultaneously, efficiently connected in the position corresponding to the plurality of connecting parts of the connector or substrate, each conductor being welded to the respective connecting part of the connector or substrate by a melted alloy layer achieving a connective condition in which electric loss is minimal.

Second Embodiment

The second embodiment according to the present invention will now be described.

In the same manner as the transmission cable described with respect to the first embodiment, a cable 51 related to this second embodiment is welded in connection to a contact of a connector or a substrate.

Figure 11:
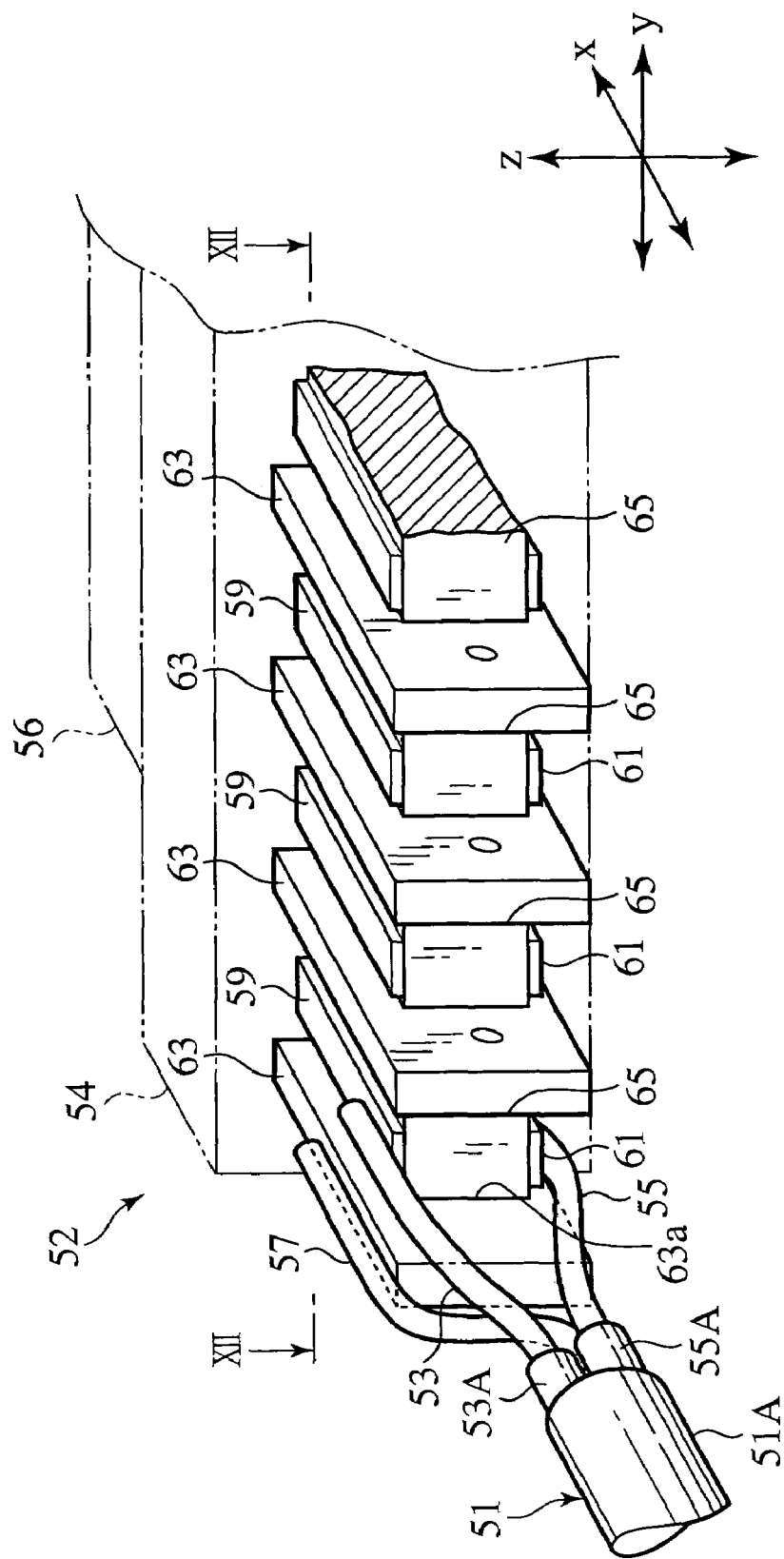
FIG. 11 is a drawing schematically showing a cable according to a second embodiment of the present invention and a connector connected thereto.
Figure 12:
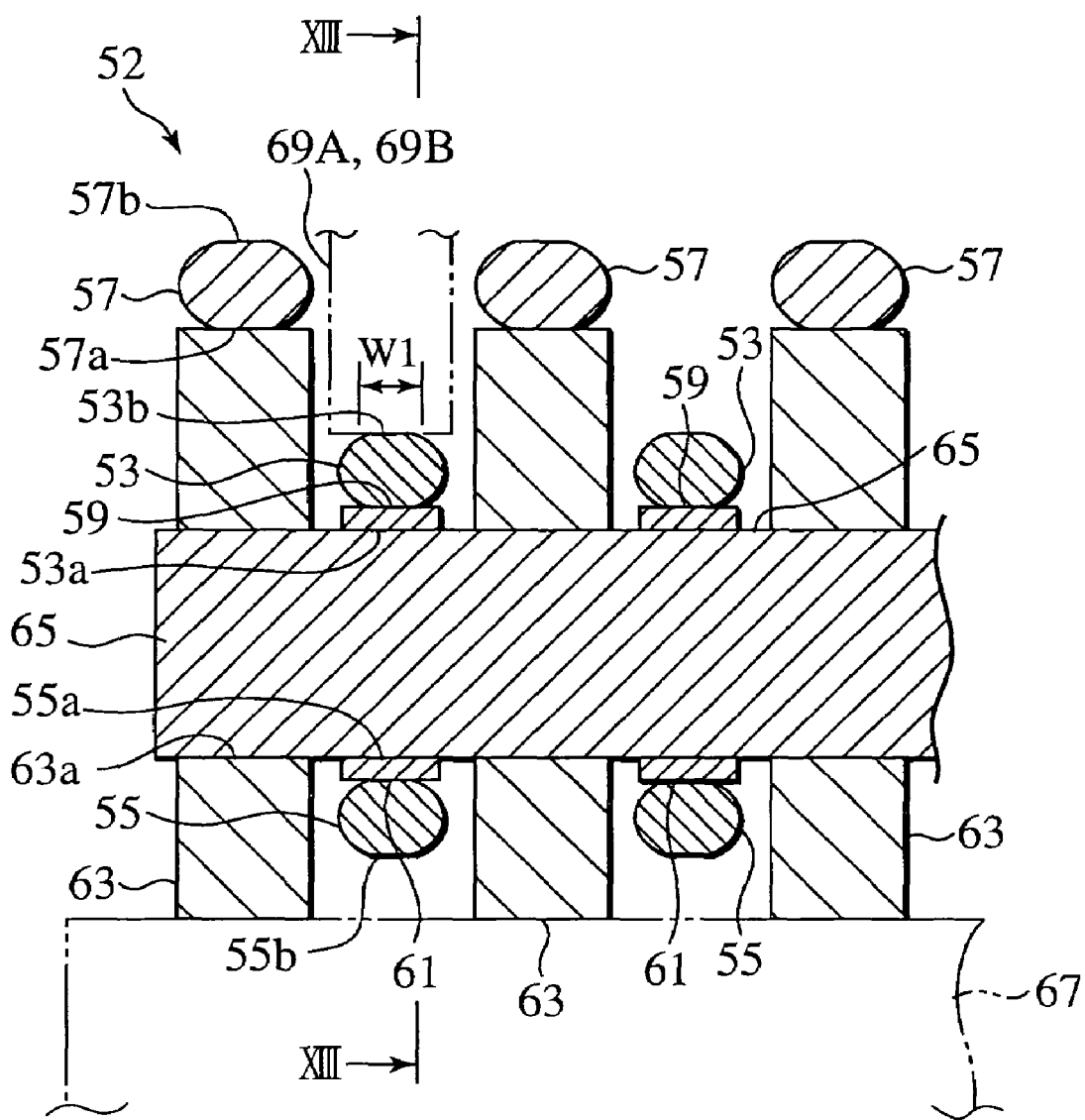
FIG. 12 is a drawing showing a cross-section taken along the line XIIA-XIIB of FIG. 11.
Figure 13:
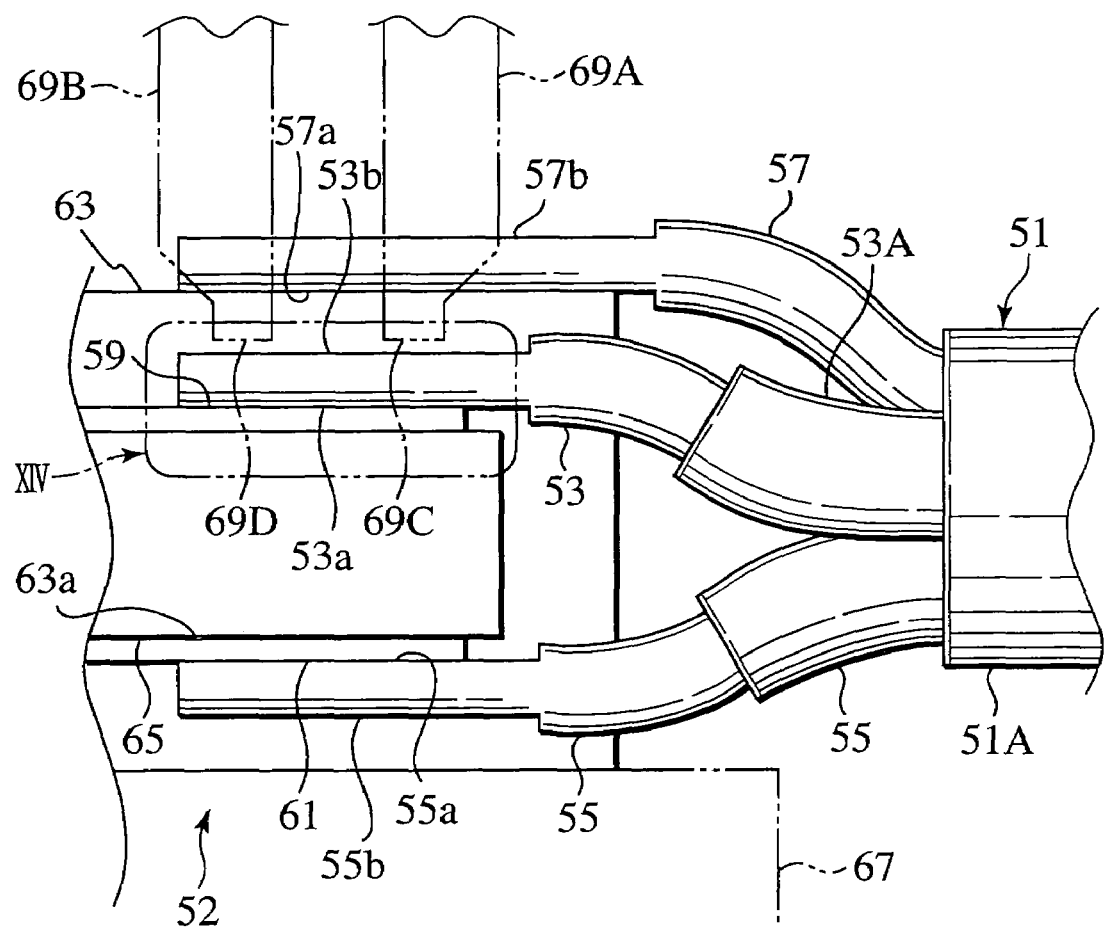
FIG. 13 a drawing showing a cross-section taken along the line XIIIA-XIIIB of FIG. 12.

FIG. 11 schematically depicts the cable 51 (cable main body) according to this second embodiment of the present invention and a substrate of a connector 52 connected thereto (hereinafter referred to simply as the "connector"). FIG. 12 shows a cross-section taken along the line XII-XII of FIG. 11 and FIG. 13 shows a cross-section taken along the line XIII-XIII of FIG. 12.

The cable 51 will now be described in detail.

The cable 51 comprises, for example, a signal wire (wire conductor) 53, a signal wire (wire conductor) 55, and a drain wire (wire conductor) 57 each comprising a conductor, the signal wires 53 and 55 being respectively covered by covering members 53A and 55A each comprising an insulating body. Further, the signal wire 53 covered by the covering member 53A, the signal wire 55 covered by the covering member 55A and the drain wire 57 extend in parallel, these wires being covered by a sheath 51A comprising an insulating body.

A thin plating formed of silver for example, is formed over the surface of the signal wires 53 and 55 and the drain wire 57 of the cable 51, and one end of each of the signal wires 53 and 55 and the drain wire 57 (an end from which the respective covering members 53A and 55A have been removed) is welded to each of the contacts 59, 61 and 63 of the connector 52.

The connector 52 will now be described.

This connector 52 comprises for example, a strip shaped signal contact 59 formed extending lengthwise in the x axial direction of FIG. 11, for a weld connection to the signal wire 53, a strip shaped signal contact 61 formed extending lengthwise in that x axial direction, for a weld connection to the 55, and a ground contact 63 formed extending lengthwise in that x axial direction, for a weld connection to the drain wire 57.

More specifically, the ground contact 63 has for example, a hexahedron shape, having an opening 63a in substantially the center thereof. A flat plate (flat plate part) 65 formed of a material having heat resistance and insulating properties, such as ceramics, is skewered through the opening 63a, and thereby a plurality of ground contacts 63 being secured to the flat plate 65.

Accordingly, when the connector 52 is viewed from y axial direction, the ground contact 63 has a protruding part or flange part protruding from a cross section of the flat plate 65 to at least the side on which the cables are disposed of the z axial direction and the x axial direction.

Further, as shown in FIG. 11, the drain wire 57 is connected to one end (the upper end) of the ground contact 63 in the z axial direction (the axis perpendicular to the y axis) thereof.

At both end faces (the front and rear faces) in the z axial direction of the flat plate (intervening member) 65, in intervals along the y axial direction of the ground contact 63, the signal contacts 59 and 61 are formed with regular intervals therebetween.

That is to say, the signal contact 59 and the signal contact 61 are disposed on the flat plate 65 in mutual opposition, the flat plate 65 being positioned therebetween.

Each of the signal wires 53 and 55 of a plurality of cables 51 are connected respectively to each of the signal contacts 59 and 61.

In this configuration, the signal contact 59 or the signal contact 61 positioned side by side along the y axial direction are easily mutually shielded from electric flow by the ground contact 63 (especially the part protruding in the z axial direction from the top face and the bottom face of the flat plate 65). Further, the exposed portions of the signal wires 53 and 55 neighboring along the y axial direction are easily mutually shielded from electric flow by the ground contact 63 (especially the part protruding from the end of the flat plate 65 to the cable 51 side along the x axial direction). In this way, crosstalk is prevented from occurring between signal contacts 59 or signal contacts 61 or between exposed signal wires 53 or exposed signal wires 55 neighboring in the y axial direction.

Further, a block main body 54 (or substrate main body) of the contact 52 is disposed to the forward side (the position extending from each cable 51 going forward in the x axial direction) of the flat plate 65 and the alternately disposed ground contacts 63, moreover, an engaging part 56 used when the connector 52 is connected to a machine such as a computer or the like is disposed at the front of the block 54.

As shown in FIG. 12 and FIG. 13, the part 53a of the signal wire 53 that comes into contact with the connecting face of the signal contact 59 is formed as a flat surface, and in the same manner, the part 55a of the signal wire 55 that comes into contact with the connecting face of the signal contact 61 is also formed as a flat surface, moreover, the part 57a of the drain wire 57 that comes into contact with the connecting face of the ground contact 63 is formed as a flat surface. Again, the parts 53b, 55b and 57b of respectively, the signal wire 53, the signal wire 55 and the drain wire 57 which parts come into contact with the pair of electrodes 69A and 69B described subsequently, are also formed as flat surfaces.

The welding device for welding each of the signal wires 53 and 55 and the drain wire 57 respectively to the contacts 59, 61 and 63 will now be described.

This welding device has a base 67 on which the connector 52 comprising each of the contacts 59, 61 and 63 as shown in FIG. 12 and FIG. 13 can be disposed, and a pair of electrodes 69A and 69B disposed mutually separated in the lengthwise direction (extending direction) of each of the signal wire 53, the signal wire 55 and the drain wire 57. Here, the base 67 is so constructed as to be able to move in the y axial direction in relation to the electrodes 69A and 69B.

Further, this welding device has a pressure applying means (not shown) for pressing the end of the signal wire 53 that contact with the signal contact 59 with the pair of electrodes 69A and 69B, such that the end of the signal wire 53 can be pressured against the connecting face of the signal contact 59, and a voltage applying means (not shown) capable of applying voltage between each of the electrodes 69A and 69B.

Flat shaped portions 69C and 69D that come into contact with each of the respective signal wires 53 and 55, and the drain wire 57 are disposed at the tip end of each of the electrodes 69A and 69B, as shown in FIG. 13.

According to the above described configuration, while moving the base 67 in the y axial direction in relation to the electrodes 69A and 69B, these electrodes are made to press the wires (signal wires) 53, 55 and 57 positioned respectively over the contacts 59, 61 and 63, and by applying the appropriate voltage to the electrodes 69A and 69B each of the wires 53, 55 and 57 can be welded respectively to each of the contacts 59, 61 and 63. When welding the wire 55 to the contact 61 on the rear face of the flat plate 65, the connector substrate part 52 can be mounted in reverse (capable of) in relation to the base 67.

Next, the operation of this welding device will be described in detail.

An example of the various conditions applying when welding operations are performed using this welding device is as follows.

The signal wire 53 is comprised of copper, and has a diameter of 0.5 mm and a silver plating of a thickness of 2 μm disposed circumferentially thereon. Further, the signal contact 59 is of phosphor bronze of a thickness (the dimension in the direction of the pressure from the pair of electrodes 69A and 69B) of about 0.2 mm, having a gold plating on the surface thereof (the surface that comes into contact with the signal wire 53) of a thickness of several μm. The area of contact between the electrode 69A and the signal wire 53 is approximately 0.3 mm$^2$ or an area larger than this, while the area of contact between the electrode 69B and the signal wire 53 also is approximately 0.3 mm$^2$ or an area larger than this, the electrode 69A and the electrode 69B being separated by a distance of between 0.5 mm and 1 mm. In other words, an interval of between 0.5 mm and 1 mm exists between the electrode 69A and the electrode 69B.

The width W1 of each flat surface part of the signal wires 53 is approximately 0.4 mm (refer to FIG. 12). Further, the signal wire 55 and drain wire 57 and each of the signal contacts 61 and 63 are of the same configuration as the signal wire 53.

At the signal contact 59 disposed on the connector 52 mounted in the base 67 of the welding device, from a condition of being in contact with an end of the signal wire 53, each of the flat shaped portions 69C and 69D of the pair of electrodes 69A and 69B separated mutually therebetween in the lengthwise direction of the signal wire 53, are pressured pressing with a force of approximately 10 N (Newton; kgm/sec$^2$) on the flat surface part 53b of the signal wire 53.

Under these pressuring conditions, an electric current is passed between the pair of electrodes 69A and 69B welding together the end of the signal wire 53 and the signal contact 59. It is preferable here that a pulse electric current of 520 A-560 A (amperes) is passed between the pair of electrodes 69A and 69B for approximately 20 ms (milliseconds).

This welding operation performed by passing the electric current will now be described in detail.

The above described pressuring action brings the electrodes 69A, 69B and the signal wire 53 into definitive mutual conduction and brings the signal wire 53 and the signal contact 59 into definitive mutual conduction. Under such conductive conditions, voltage is applied between each of the electrodes 69A and 69B, delivering a pulse electric current flowing to the signal wire 53 and the signal contact 59. Here the electrical resistance of the signal contact 59 is greater than the electrical resistance of the signal wire 53, moreover, the electrical resistance between the signal contact 59 and signal wire 53 is greater than the electrical resistance between the signal wire 53 and the electrode 69A or the electrode 69B. Accordingly, the signal contact 59 existing between each of the electrodes 69A and 69B mainly becomes hot as a result of this applied current.

More specifically, at the signal contact 59, firstly the area of contact with the signal wire 53 begins to become heated, thereafter, this heating part gradually expands in the direction of the depth of the signal contact 59 (the direction away from the signal wire 53). In addition to a portion of the signal contact 59 melting due to this heating, the signal wire 53 also melts to a degree in the vicinity of the area of contact thereof with the signal contact 59, thereby welding the signal wire 53 and the signal contact 59 mutually together.

Moreover, the signal contact 59 undergoes a color change due to this heating. This color change also begins in the area of contact with the signal wire 53 and, in the same manner, expands thereafter gradually in the direction of the depth of the signal contact 59 (the direction away from the signal wire 53).

Further, since the surface of the signal wire 53 is covered with a thin layer of silver, as the signal contact 59 melts, this silver expands in the direction of the depth of the signal contact 59 (the direction away from the signal wire 53).

The electrodes 69A and 69B are formed for example of a copper alloy including molybdenum and therefore do not weld to the signal wire 53.

The condition of the metal in the welded portion of the signal wire 53 and the signal contact 59 will now be described.

Figure 14:
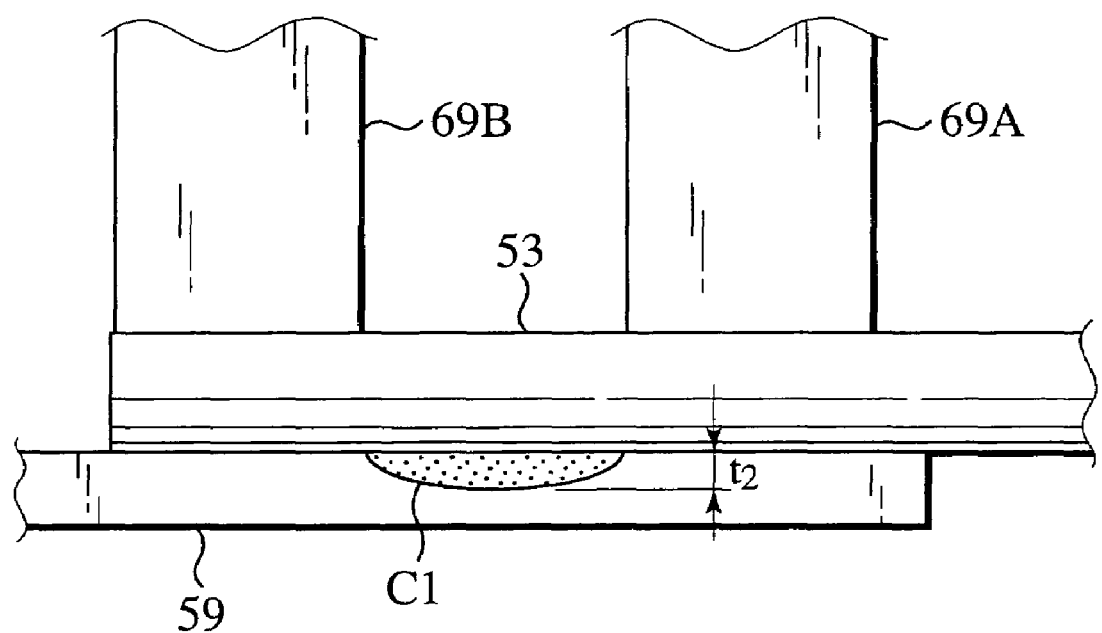
FIG. 14 is an enlarged view of the part XIV of FIG. 13, showing the condition of a welded part formed by the welding of a signal wire and a signal contact.
Figure 15:
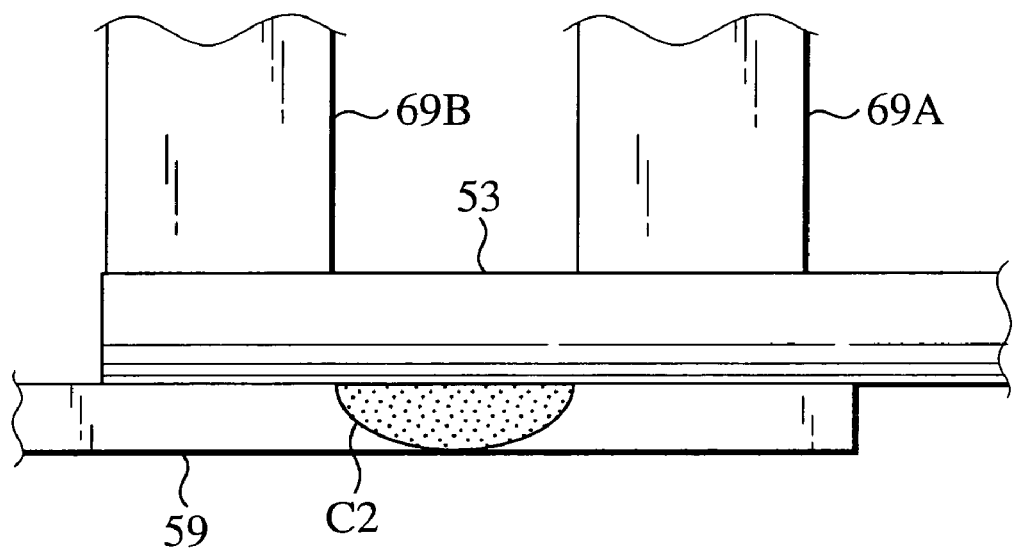
FIG. 15 is an enlarged view of the part XIV of FIG. 13, showing the condition of a welded part formed by the welding of a signal wire and a signal contact.
Figure 16:
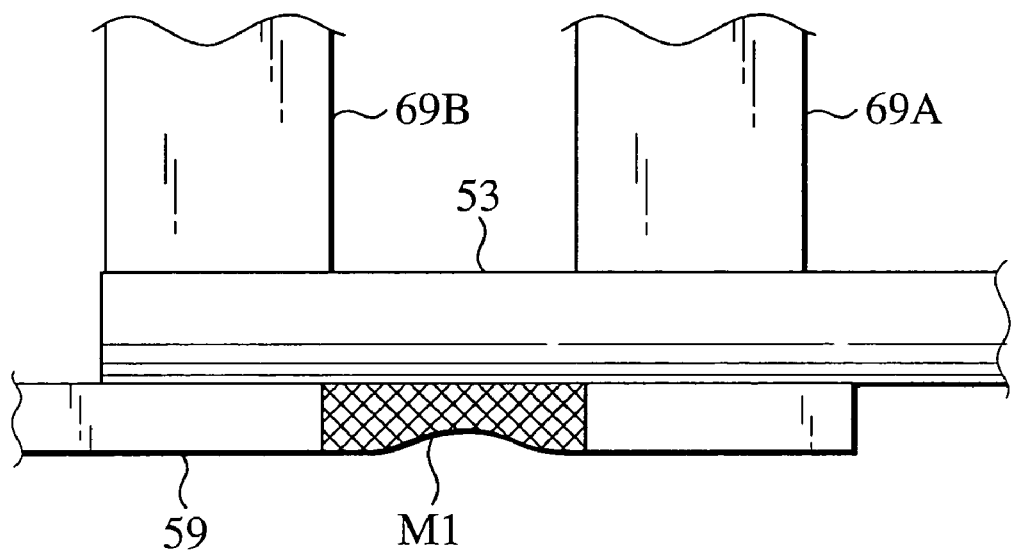
FIG. 16 is an enlarged view of the part XIV of FIG. 13, showing the condition of a welded part formed by the welding of a signal wire and a signal contact.

FIGS. 14 to 16 are expanded views of the part XIV in FIG. 13, illustrating the condition of the metal in the welded portion formed by the welding of the signal wire 53 and the signal contact 59.

FIG. 14 illustrates the condition of the metal in the case in which the degree of thermal melting is comparatively small (for example, when the value of electric current flowing to the signal contact 59 from the electrodes 69A and 69B is small). FIG. 15 illustrates the welding in a more advanced condition than that shown in FIG. 14 and FIG. 16 illustrates the welding in a more advanced condition than that shown in FIG. 15.

In FIG. 14, the color changed part C1 is formed in the signal contact 59 due to the welding process described above, the color changed part having an arc shaped cross-section in the longitudinal direction of the signal wire 53. In that drawing, the depth t2 of the top point of the color changed part C1 (from the area of contact between the signal contact 59 and the signal wire 53, in the direction away from the internal portion of the signal contact 59, the top of the color changed part C1 being positioned at the point most distantly separated from that area of contact) is approximately 0.1 mm.

In FIG. 15, the depth of the top of the color changed part C2 is 0.2 mm (the same value as the thickness of the signal contact 59 formed in a plate shape). In other words, the top point of the color changed part C2 reaches the face of the opposite side of that area of contact of the signal contact 59.

FIG. 16 shows the part of the signal contact 59 that is blasted (exploded) by the above welding operation. Blasting (explosion) refers to an extreme welding condition in which the welded part of the signal contact 59 is heated such that a portion of that welded part is explosively dispersed, an opening being opened in that welded part thereby. The nugget part M1 of the signal contact 59 in FIG. 16, is formed by the distortion from the heat due to this blasting (creating a concavity for example in the direction of the signal wire 53).

Here, it is preferable for the degree of welding of the signal wire 53 and the signal contacts 59 to be within the scope from the condition as shown in FIG. 14 (that is to say, the condition in which the depth t2 of the color changed part C1 is approximately 0.1 mm) to the condition immediately prior to that shown in FIG. 16, in other words, the condition immediately prior to the condition in which the signal contact 59 is blasted (for example the condition in which the color changed part arising in the signal contact 59 is proceeding more than the condition shown in FIG. 15 but part of the color changed part is still maintaining an arc shape).

Further, it is more preferable for the degree of welding of the signal contacts 59 and 53 to be within the scope from the condition shown in FIG. 14 to the condition (FIG. 15) in which the top of the color changed part arising in the signal contact 59 reaches the face of the opposite side of the area of contact of the signal contact 59 (the area of contact of the signal contact 59 and the signal wire 53).

The description in the above examples of the degree of the welding (the extent of heating and melting) was illustrated with respect to the blasting and color changing part arising due to the welding, however this degree of welding can also be illustrated with respect to other parameters.

For example, the degree of welding could be illustrated with respect to the degree of dispersion to the signal contact 59 of the silver thinly covering the surface of the signal wire 53. Here, it is preferable for the depth of the silver alloy layer formed in the signal contact 59 by the dispersion of the silver to be within the scope from the condition of 5 μm to the condition of half of the thickness of the signal contact 59.

When another kind of noble metal such as gold, platinum or palladium is used for the plating of the signal wire 53 instead of silver, it is desirable that the welding condition is within the same scope as when the silver plating is used.

The welding has been described with respect to the welding of the signal wire 53 and the signal contact 59 however the same applies with respect to the welding of the signal wire 55 and the signal contact 61 and the welding of the drain wire 57 and the ground contact 63.

The results of tests implemented on the signal wire 53 and the signal contact 59 welded as described above will now be described.

Figure 17:
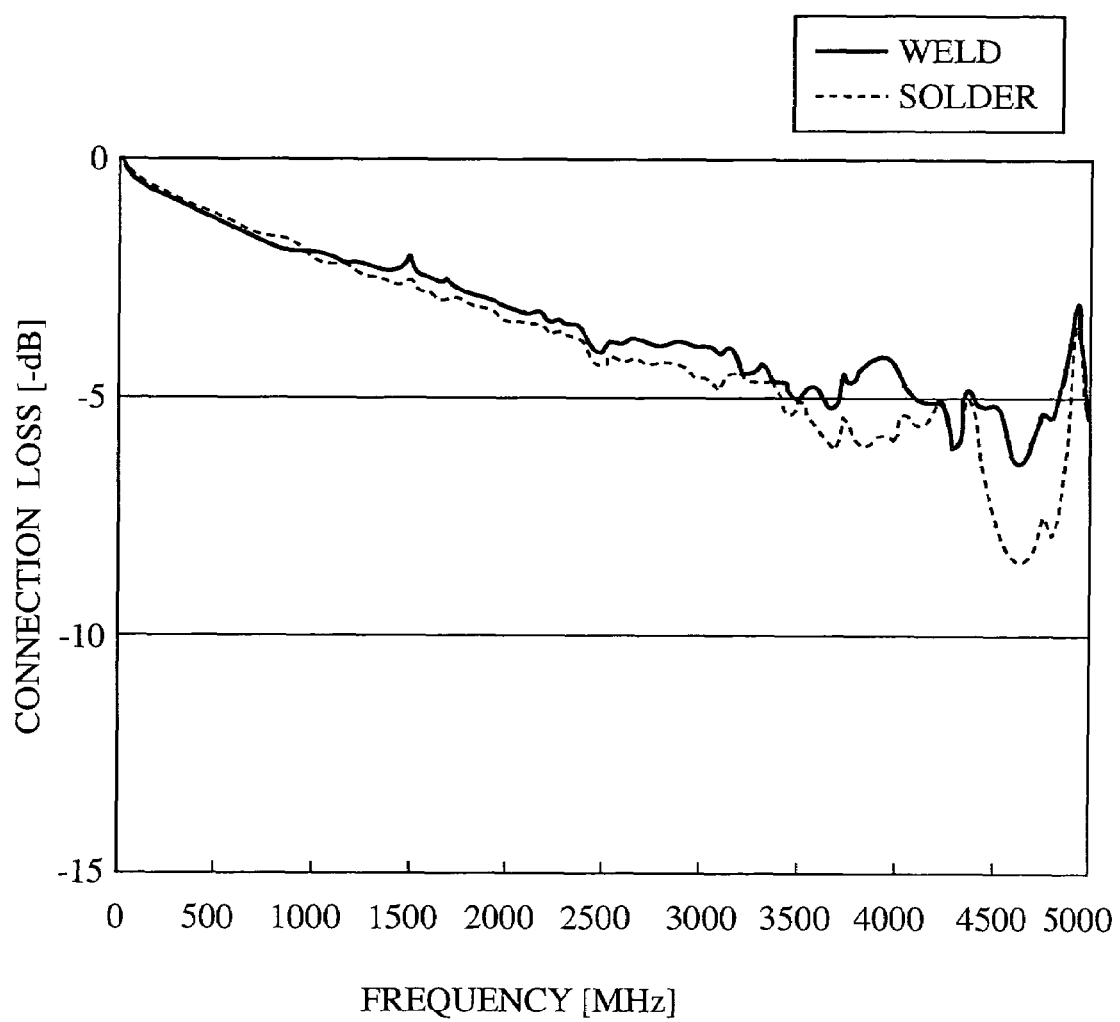
FIG. 17 is a graph showing connection loss of a connection between a signal wire and a contact.

FIG. 17 shows connection loss of a connection between a signal wire and a contact. The horizontal axis in FIG. 17 shows the frequency of a signal transmitted on a cable and the vertical axis shows connection loss. The smaller the value shown on the vertical axis in FIG. 17 the greater the degree of connection loss.

The broken line in FIG. 17 shows connection loss when the signal wire and the contact of a connector are soldered together, and the solid line shows connection loss in the case where the signal wire and the contact of a connector are connected by welding.

The conditions illustrated with respect to the soldering connection relating to the graph shown by the broken line in FIG. 17 and the graph shown by the broken line in FIG. 18 will now be described.

For that soldering operation, the signal wire is soldered to a paddle card (a conductive substrate to be disposed between the signal wire and the contact) and the signal wire and the contact are then connected so as to allow flow of electric current therethrough by mounting the paddle card on the connector. That is to say, the signal wire is connected to the contact via the paddle card.

As can be seen from FIG. 17, the loss affecting the soldered transmission cable is greater in comparison to that of the welded transmission cable when exceeding 1000 MHz (1 GHz) signal transmission frequency, and when the signal frequency exceeds 2500 MHz (2.5 GHz) the difference between the two increases remarkably.

Next, the relationship between the condition of the connection between a signal wire and a connector and the frequency of the occurrence of errors when a signal is transmitted on the cable due to that condition of connection will be described with reference to FIG. 18.

The test to determine the occurrence of errors was performed under the following conditions.

(1) A signal wire and contact mutually connected by welding (hereinafter "welded signal wire") and a signal wire and a contact mutually connected by soldering (hereinafter "soldered signal wire") were extended in the same manner.

(2) A separate noise signal wire was then disposed extended along the welded signal wire or the soldered signal wire.

(3) A 3 G bit/sec signal was delivered along the soldered signal wire or the welded signal wire and a 3 G bit/sec noise signal was delivered along the noise signal wire, while the signal transmission errors occurring during this time on the welded signal wire and the soldered signal wire were measured.

Figure 18:
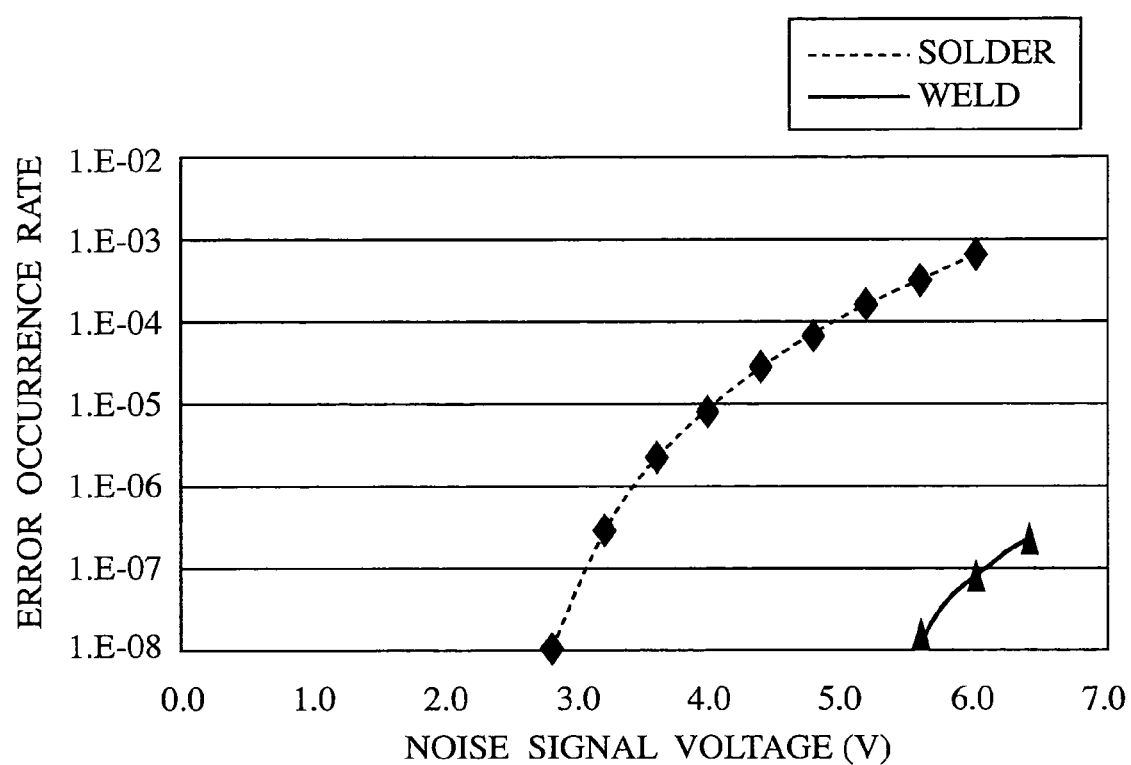
FIG. 18 shows the condition of a connection between a signal wire and a contact and the occurrence of errors when a signal is transmitted through this connection.

The horizontal axis in FIG. 18 shows the voltage of the noise signal flowing in the noise signal wire, while the vertical axis in FIG. 18 shows the rate of the occurrence of errors when a signal was transmitted on the welded signal wire or the soldered signal wire. For example, "1.E−03" shows "$1 \times 10^{-3}$", showing that for a transmission signal of 1,000 bits 1 bit of transmission errors occurred.

In FIG. 18, the broken line shows the condition of error occurrence affecting the soldered signal wire, the solid line illustrating the condition of error occurrence affecting the welded signal wire.

As can be seen from FIG. 18, when the voltage of the noise signal is for example 6V the rate of occurrence of errors on the soldered signal wire is 1 bit for approximately 1,000 bits, while in contrast to this the rate of the occurrence of errors on the welded signal wire is 1 bit for approximately $10^7$ bits, thus the rate of the occurrence of errors in the case of the welded signal wire is remarkably smaller than the rate of the occurrence of errors affecting the soldered signal wire.

It is believed that the reason for this difference is that in the case of the soldered connection skirt shaped solder appears, that is to say, the width of the connecting part becomes bigger such that the interval between the noise signal wire and the signal wire is reduced, while in the configuration transmitting the signal without passing via the paddle card, errors arising in the paddle card are eliminated.

Accordingly, signal transmission using the welded signal wire realizes a significant reduction in the occurrence of crosstalk in comparison to signal transmission using the soldered signal wire.

The relationship between the conditions of connection between a signal wire and a contact and the connection strength from this connected state will now be described with reference to FIG. 19.

Figure 19:
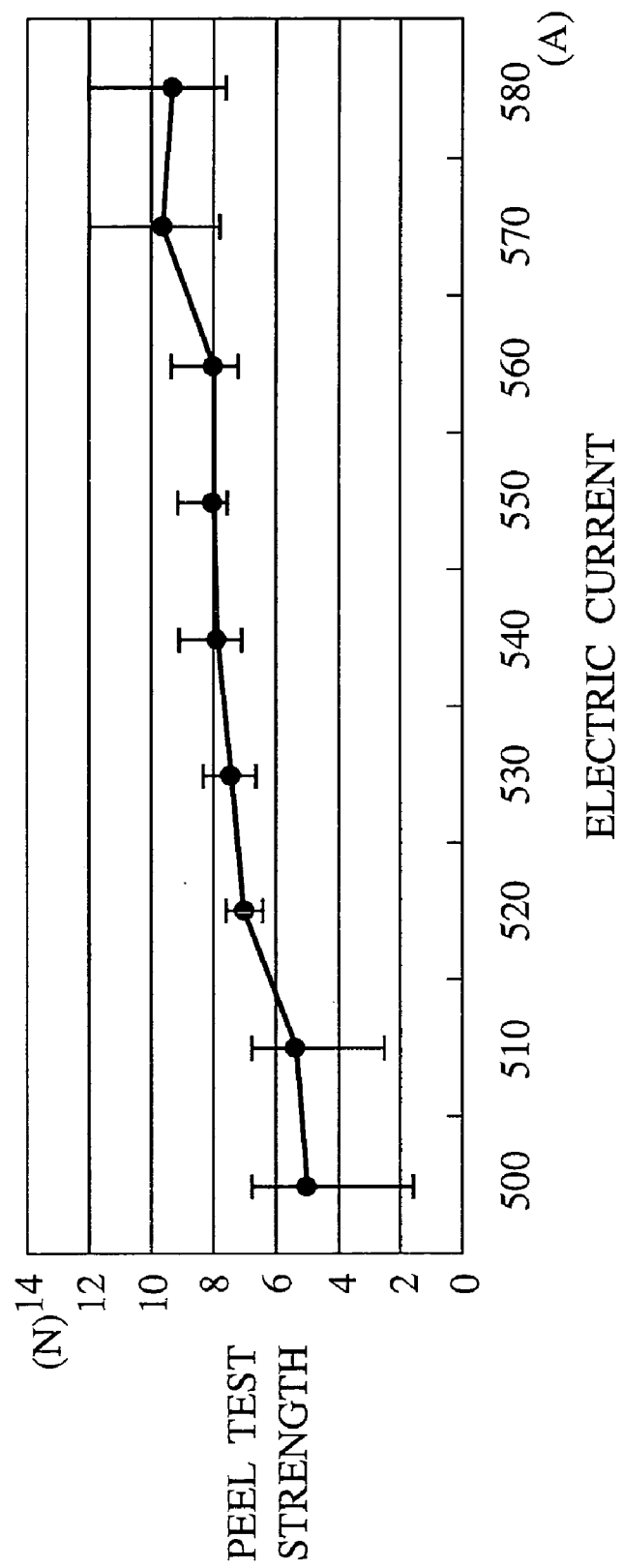
FIG. 19 shows the condition of a connection between a signal wire and a contact and the connection strength of this connection.

The horizontal axis in FIG. 19 represents the value for electric current flowing from the voltage applied by the pair of electrodes 69A and 69B, while the vertical axis in FIG. 19 shows the tested peel strength (refer to the description of the first embodiment) of the welded part.

Here, the straight lines extending vertically over each of the values for electric current represent dispersion of connective strength for a plurality of samples at each of those electric current values. The polygonal line extending in the horizontal axial direction in FIG. 19 connects the average values for connection strength at each of those electric current values.

For example, for electric current of 500 A, the average value for peel test strength is approximately 5 N, the lowest value being approximately 1.6 N and the highest value approximately 7 N.

As can be seen from FIG. 19, in the region of electric current values from 520 A to 560 A, the average value for connection strength remains between approximately 8 N and 10 N and the dispersion of connection strength at each electric current value remains within 2 N. Accordingly, it is desirable in the welding of the signal wire and contact to set the electric current value between 520 A and 560 A.

The degree of the welding at the electric current value 520 A of FIG. 19 is the condition in which the depth of the color changed part of the signal contact 59 is 0.1 mm as shown in FIG. 14, and the degree of welding at the electric current value of 570 A of FIG. 19 is the condition in which blast occurs affecting the signal contact 59 as shown in FIG. 16.

When a signal wire (a drain wire) and a signal contact (a ground contact) are welded together, adherence to each of the above described conditions is not necessary and these conditions may be changed as appropriate if the connection loss is to be reduced, the occurrence of signal transmission errors is to be reduced and the degree of tested peel strength is to be maintained.

According to the connection method of the above described embodiment, pressure is applied by a pair of electrodes 69A and 69B separated mutually in the lengthwise direction of each of the signal wires 53 and 55 and the drain wire 57 of the cable 51, pressuring each end of each of the above signal wires 53 and 55 and the drain wire 57 of this cable 51 to the connecting faces of the contacts 59, 61 and 63 respectively and an electric current is passed between the pair of electrodes 69A and 69B such that end of the cable 51 and each of the connecting faces are mutually welded together, thus, an alloy layer can be definitively formed along the connecting faces by the welding of each of those contacts 59, 61 and 63. Due to the existence of the alloy layer, changes in the structure and composition between each of the signal wires 53 and 55 and the drain wire 57 and each of those respective contacts 59, 61 and 63 do not occur rapidly, but as these changes occur gradually and successively, when a high frequency signal is transmitted between each of those signal wires 53 and 55 and the drain wire 57 and each of those respective contacts 59, 61 and 63, reflection of the transmitted signal does not occur easily, leading to decreased attenuation of the signal.

Further, as each of those signal wires 53 and 55 and the drain wire 57 are welded respectively to the contacts 59, 61 and 63, the signal wires 53 and 55 and the drain wire 57 are more efficiently connected with the respective contacts 59, 61 and 63 than if connected by soldering and an improved degree of connection strength is achieved.

Moreover, as each of those signal wires 53 and 55 and the drain wire 57 are welded respectively to the contacts 59, 61 and 63, the padding part of solder that results from a soldering connection is not necessary, accordingly the space required for the connection when each of those signal wires 53 and 55 and the drain wire 57 are welded respectively to the contacts 59, 61 and 63 (the space in the direction of the diameter of the signal wires) is less than the space that would be required in the case of a soldered connection.

Again, according to the above connection method, the condition can be easily managed such that the degree of the welding is within the scope from the condition in which the depth of the top of the color changed part of an arc shape formed in each of the contacts 59, 61 and 63 is above 0.1 mm, to the condition immediately prior to the condition of blasting of each of the contacts 59, 61 and 63, therefore a high quality condition can be achieved in the welded part.

Further, as the part of each of the signal wires 53 and 55 and the drain wire 57 that comes into contact with the connecting face of respectively, the contacts 59, 61 and 63 is formed as a flat surface shape, and as the part of each of the signal wires 53 and 55 and the drain wire 57 that comes into contact with each of the electrodes 69A and 69B is formed as a flat surface shape, a substantial area of contact can be achieved between each of the contacts 59, 61 and 63 and the respective signal wires 53 and 55 and the drain wire 57, thereby realizing an improved degree of strength of the welding of each of the contacts 59, 61 and 63 and the respective signal wires 53 and 55 and the drain wire 57. Moreover, according to the above described configuration, when each of the signal wires 53 and 55 or the drain wire 57 is placed into contact with the respective contacts 59, 61 or 63 (in order to weld each of the signal wires 53 and 55 and the drain wire 57 to the respective contacts 59, 61 and 63), a stable condition of the placement thereof is achieved.

Again, as that part of each of the signal wires 53 and 55 or the drain wire 57 that comes into contact with each of the electrodes 69A and 69B is shaped as a flat surface, when each of those signal wires 53 and 55 or the drain wire 57 are pressed by the electrodes 69A and 69B, electrical resistance between those electrodes 69A and 69B and signal wires 53 and 55 or drain wire 57 is reduced, further the pressure exerted on each unit of area arising between the electrodes 69A and 69B and the signal wires 53 and 55 or drain wire 57 is reduced, thus the occurrence of welding (adhesion) between the electrodes and the signal wires 53 and 55 or drain wire 57 is easily prevented.

The cable 51 has an alloy layer formed in the connecting parts between each of the signal wires 53 and 55 or the drain wire 57 and the contacts 59, 61 and 63 respectively by the welding extending in the lengthwise direction (direction of extension) of those signal wires 53 and 55 and drain wire 57, and as the degree of the welding of those welded parts is within the scope from the condition in which the depth of the top of the color changed part of an arc shape formed in each of the contacts 59, 61 and 63 is above 0.1 mm to the condition immediately prior to the condition of blasting of each of those contacts, due to the existence of that alloy layer, changes in the structure and composition between each of the signal wires 53 and 55 and the drain wire 57 and each of those respective contacts 59, 61 and 63 occur gradually and successively, such that when a high frequency signal is transmitted between each of those signal wires 53 and 55 and the drain wire 57 and those respective contacts 59, 61 and 63, reflection of the transmitted signal does not occur easily, leading to decreased attenuation of the signal.

Further, as each of the signal wires 53 and 55 or the drain wire 57 and the respective contacts 59, 61 and 63 are mutually welded, in the same manner, when a high frequency signal is transmitted between those signal wires 53 and 55 or drain wire 57 and those contacts 59, 61 and 63, reflection of the transmitted signal does not occur easily thus there is a reduction in the number of errors occurring during such transmission.

Moreover, as each of the signal wires 53 and 55 or the drain wire 57 and the contacts 59, 61 and 63 are respectively mutually welded, the signal wires 53 and 55 and the drain wire 57 are more efficiently connected with each of the respective contacts 59, 61 and 63 than if connected by soldering and an improved degree of connection strength in those connections is achieved.

Moreover, as each of those signal wires 53 and 55 and the drain wire 57 and each of the contacts 59, 61 and 63 are respectively mutually welded, the padding part of solder that results from a soldering connection is not necessary, accordingly the space required for the connection when each of those signal wires 53 and 55 and the drain wire 57 are connected respectively to each of the contacts 59, 61 and 63 is less than the space that would be required in the case of a soldered connection.

Again, according to the cable 51, as the part of each of the signal wires 53 and 55 and the drain wire 57 that comes into contact with the respective connecting face of each of the contacts 59, 61 and 63 is formed as a flat surface shape, and as the part of each of the signal wires 53 and 55 and the drain wire 57 that comes into contact with each of the electrodes 69A and 69B is formed as a flat surface shape, a substantial area of contact can be achieved between each of the contacts 59, 61 and 63 and each of the signal wires 53 and 55 and the drain wire 57 respectively, thereby enabling a high degree of strength to be realized in the welding of each of the contacts 59, 61 and 63 and each of the respective signal wires 53 and 55 or the drain wire 57.

Again, as that part of each of the signal wires 53 and 55 or the drain wire 57 that comes into contact with each of the electrodes 69A and 69B is shaped as a flat surface, when each of those signal wires 53 and 55 or the drain wire 57 are pressed by those electrodes 69A and 69B, electrical resistance between those electrodes 69A and 69B and signal wires 53 and 55 or drain wire 57 is reduced, further the pressure exerted on each unit of area arising between the electrodes 69A and 69B and the signal wires 53 and 55 or drain wire 57 is reduced, thus the occurrence of welding (adhesion) between the electrodes 69A and 69B and the signal wires or drain wire is easily prevented.

According to the welding device of the cable 51, the connector 52 having each of the contacts 59, 61 and 63 and each end of each of the signal wires 53 and 55 and the drain wire 57 of the cable 51 are disposed on the base 67, and each end of each of those signal wires 53 and 55 and drain wire 57 are then pressed by a pair of electrodes 69A and 69B mutually separated in the lengthwise direction of those signal wires 53 and 55 and drain wire 57, thereby pressuring each of those ends of those signal wires 53 and 55 and the drain wire 57 against the connecting face of each of the contacts 59, 61 and 63 respectively, wherein voltage is applied between those electrodes 69A and 69B enabling each of those signal wires 53 and 55 and the drain wire 57 to be welded to each of those respective contacts 59, 61 and 63. Accordingly, by using the welding device, cable connection can be easily performed and the cable 51 with one end welded to the connector 52 can be easily produced.

Moreover, according to the welding device of the cable 51, a configuration is realized wherein even when there are a plurality of groupings of each of the contacts 59, 61 and 63 with each of the respective signal wires 53 and 55 and the drain wire 57 existing in the connector (substrate), the pair of electrodes 69A and 69B can move relative to the appropriate position to enable welding of each of the respective groupings, being able to apply pressure to each of those respective groupings. Accordingly, even when a plurality of welded parts of the cable 51 and the connector 52 are disposed in the connector, each cable can easily be welded to each respective contact of the connector, also, the welding can be performed on the plurality of locations simply by providing the pair of electrodes 69A and 69B and a power source for those electrodes, thereby realizing a simple structure for the welding device.

Again, as the pair of electrodes 69A and 69B can move (in the vertical direction in FIG. 13) in the performance of the welding operation, even if there is a slight difference in the respective heights of each of the signal wires 53 and 55 or the drain wire 57 of each cable, the appropriate degree of application of pressure can easily be maintained.

The entire contents of Japanese Patent Application No. 2002-102769 (filed on Apr. 4, 2002) and Japanese Patent Application No. 2002-176210 (filed on Jun. 17, 2002), are incorporated by reference herein.

It is to be understood that the present invention is not limited to the embodiments described above but may be practiced otherwise than as described by modifying appropriately.

The invention claimed is:

1. A method for connecting a round conductive wire of a cable to a flat contact of a connector or substrate, the method comprising:
    pressing an end portion of a round conductive wire to form a pair of opposing flat surfaces in the end portion;
    setting the end portion of the round conductive wire on a flat contact of a connector such that one of the flat surfaces of the round conductive wire comes in contact with the flat contact;
    setting a pair of electrodes on the other of the flat surfaces of the round conductive wire on a side opposite to the flat contact, the pair of electrodes being mutually spaced apart in a longitudinal direction of the round conductive wire; and
    welding the one of the flat surfaces of the round conductive wire to the flat contact by passing an electric current between the pair of electrodes.

2. A cable comprising:
    a connector including a base having a plurality of flat contacts; and
    a cable main body including a plurality of round conducting wires, each of the round conducting wires having a pair of opposing flat surface formed in the end portion thereof, each of the round conducting wires is electrically connected to each of the flat contacts at a part of one of the flat surfaces by welding.

3. The cable according to claim 2, wherein:
    a long elongated welded part is formed along the lengthwise direction of each of the round conducting wires in each connecting part between the flat contacts and the round conducting wires,
    the state of the welding in the welded part is within the scope from the condition in which the depth at the top of a color changed part forming an arc on the signal contact is above 0.1 mm to the condition immediately prior to the condition of blasting of the signal contact.

4. The cable according to claim 2, wherein:
    a welded part is formed in each connecting part between the flat contacts and the round conducting wires,
    the state of welding in the welded part is within the scope from the condition in which the dispersion of a layer of precious metal thinly covering the surface of the signal wire forms an alloy layer of that precious metal in the signal contact that is of a depth of 5 μm to the condition in which the alloy layer is half the thickness of the signal contact.

5. A cable comprising:
a connector including:
    a plurality of ground contacts each having a hexahedron shape and having an opening in the center thereof,
    a flat plate formed of a material having a heat resistance and insulating properties, said flat plate passing through the openings to secure the ground contacts so that the ground contacts are disposed apart from each other,
    a plurality of first signal contacts each disposed between the adjacent ground contacts at one side of the flat plate in the thickness direction, and
    a plurality of second signal contacts each disposed between the adjacent ground contacts at the other side of the flat plate in the thickness direction, and
a cable main body including a plurality of first signal wires, a plurality of second signal wires, and a plurality of drain wires,
wherein ends of the first signal wires are separately connected to the respective first signal contacts, ends of the second signal wires are separately connected to the respective second signal contacts, and ends of the drain wires are separately connected to the respective ground contacts,
the first and second signal contacts are located inside the ground contacts when viewed from the passing direction of the flat plate through the ground contacts, and the ends of the drain wires are located on the same side of the respective ground contacts.

6. The cable according to claim 5, wherein:
exposed portions of the signal wires are located inside the ground contacts in the thickness direction when viewed from the passing direction of the flat plate through the ground contacts.

7. The cable according to claim 5, wherein:
a long elongated welded part is formed along the lengthwise direction of each of the signal wires in each connecting part between the signal contacts and the signal wires,
the state of the welding in the welded part is within the scope from the condition in which the depth at the top or a color changed part forming an arc on the signal contact is above 0.1 mm to the condition immediately prior to the condition of blasting of the signal contact.

8. The cable according to claim 5, wherein:
a welded part is formed in each connecting part between the signal contacts and the signal wires,
the state of welding in the welded part is within the scope from the condition in which the dispersion of a layer of precious metal thinly covering the surface of the signal wire forms an alloy layer of that precious metal in the signal contact that is of a depth of 5 μm to the condition in which the alloy layer is half the thickness of the signal contact.

* * * * *